United States Patent
Kang

(10) Patent No.: US 12,230,580 B2
(45) Date of Patent: Feb. 18, 2025

(54) METHOD OF MANUFACTURING SEMICONDUCTOR PACKAGE, AND SEMICONDUCTOR PACKAGE

(71) Applicant: SAMSUNG ELECTRONICS CO., LTD., Suwon-si (KR)

(72) Inventor: Junghoon Kang, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 415 days.

(21) Appl. No.: 17/695,478

(22) Filed: Mar. 15, 2022

(65) Prior Publication Data
US 2023/0005843 A1    Jan. 5, 2023

(30) Foreign Application Priority Data

Jul. 2, 2021   (KR) .................. 10-2021-0086935

(51) Int. Cl.
*H01L 23/538*   (2006.01)
*H01L 21/48*   (2006.01)
(Continued)

(52) U.S. Cl.
CPC ...... *H01L 23/5389* (2013.01); *H01L 21/4857* (2013.01); *H01L 23/3128* (2013.01); *H01L 23/5383* (2013.01); *H01L 23/5385* (2013.01); *H01L 24/32* (2013.01); *H01L 24/83* (2013.01); *H01L 2224/2929* (2013.01);
(Continued)

(58) Field of Classification Search
CPC ............. H01L 23/5389; H01L 21/4857; H01L 23/3128; H01L 23/5383; H01L 23/5385; H01L 24/32; H01L 24/83; H01L 2224/2929; H01L 2224/29316; H01L 2224/29339; H01L 2224/29344;
(Continued)

(56) References Cited

U.S. PATENT DOCUMENTS 9,324,696 B2   4/2016   Choi et al.
9,583,472 B2   2/2017   Chung et al.
(Continued)

FOREIGN PATENT DOCUMENTS

KR   10-2000-0004060 A   1/2000
KR   10-0821962 B1   4/2008
KR   10-1640078 B1   7/2016

*Primary Examiner* — Fernando L Toledo
*Assistant Examiner* — Neil R Prasad
(74) *Attorney, Agent, or Firm* — Sughrue Mion, PLLC

(57) ABSTRACT

A method includes attaching a first anisotropic conductive film including first conductive particles to a front surface of a substrate structure; compressing a first redistribution structure on the front surface of the substrate structure such that a first redistribution conductor of the first redistribution structure that is exposed is electrically connected by the first conductive particles to a connection terminal or a vertical connection conductor that is exposed from the substrate structure, attaching a second anisotropic conductive film including second conductive particles to a rear surface of the substrate structure; and compressing a second redistribution structure on the rear surface of the substrate structure such that a second redistribution conductor of the second redistribution structure that is exposed is electrically connected by the second conductive particles to the vertical connection conductor.

20 Claims, 22 Drawing Sheets

(51) Int. Cl.
 *H01L 23/00* (2006.01)
 *H01L 23/31* (2006.01)
(52) U.S. Cl.
 CPC ............... *H01L 2224/29316* (2013.01); *H01L 2224/29339* (2013.01); *H01L 2224/29344* (2013.01); *H01L 2224/29355* (2013.01); *H01L 2224/32227* (2013.01); *H01L 2224/83203* (2013.01)
(58) Field of Classification Search
 CPC . H01L 2224/29355; H01L 2224/32227; H01L 2224/83203
 See application file for complete search history.

(56) References Cited

U.S. PATENT DOCUMENTS

| | | |
|---|---|---|
| 10,170,403 B2 | 1/2019 | Lin et al. |
| 10,818,584 B2 | 10/2020 | Hu |
| 10,854,551 B2 | 12/2020 | Yu et al. |
| 11,961,797 B2 * | 4/2024 | Kim ................. H01L 23/49811 |
| 2002/0053668 A1 | 5/2002 | Kim |
| 2013/0214431 A1 | 8/2013 | Lin et al. |
| 2014/0327129 A1 * | 11/2014 | Cho .................... H01L 23/3675 |
| | | 257/713 |
| 2016/0104659 A1 | 4/2016 | Park et al. |
| 2019/0131241 A1 | 5/2019 | Jeng et al. |
| 2021/0104507 A1 | 4/2021 | Patil et al. |

* cited by examiner

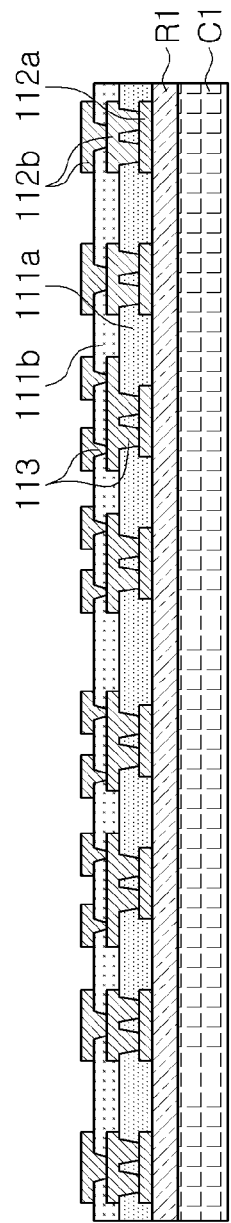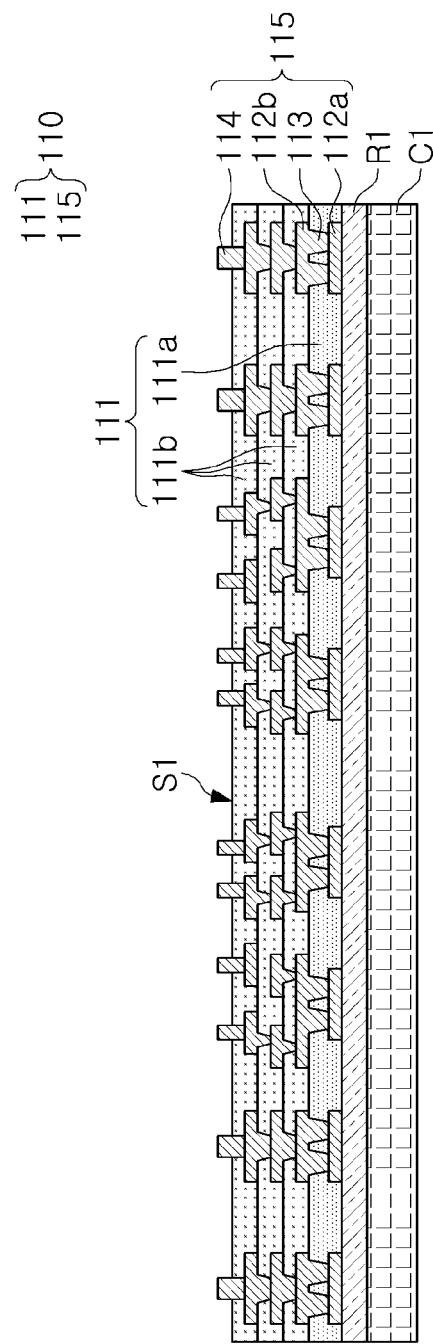

METHOD OF MANUFACTURING SEMICONDUCTOR PACKAGE, AND SEMICONDUCTOR PACKAGE

CROSS TO REFERENCE TO RELATED APPLICATION(S)

This application claims priority from Korean Patent Application No. 10-2021-0086935 filed on Jul. 2, 2021 in the Korean Intellectual Property Office, the disclosure of which is incorporated by reference herein in its entirety.

BACKGROUND

Example embodiments of the present disclosure relate to a method of manufacturing a semiconductor package, and a semiconductor package.

In accordance with the recent trend for high performance and miniaturization of electronic devices, a package-on-package (POP) technology in which a lower package and an upper package are vertically stacked has been developed in the field of semiconductor packaging. The lower package may require a first redistribution conductor for connecting to a main substrate, and a second redistribution conductor for connecting to an upper package. Accordingly, when the first redistribution conductor and the second redistribution conductor are formed in sequence, a turnaround time (TAT) of the lower package may increase.

SUMMARY

It is an aspect to provide a method of manufacturing a semiconductor package of which a turnaround time (TAT) is reduced, and a semiconductor package.

According to an aspect of one or more example embodiments, there is provided a method comprising forming a substrate structure including a semiconductor chip including a connection terminal, a vertical connection conductor disposed around the semiconductor chip, and an encapsulant encapsulating at least a portion of the semiconductor chip and the vertical connection conductor, the substrate structure having a front surface at which at least a portion of each of the connection terminal and the vertical connection conductor is exposed, and a rear surface disposed opposite to the front surface; forming a first redistribution structure including at least one first insulating layer, and a first redistribution conductor disposed in the at least one first insulating layer, the first redistribution structure having a first surface at which at least a portion of the first redistribution conductor is exposed; forming a second redistribution structure including at least one second insulating layer, and a second redistribution conductor disposed in the at least one second insulating layer, the second redistribution layer having a second surface at which at least a portion of the second redistribution conductor is exposed; attaching a first anisotropic conductive film including first conductive particles to the front surface of the substrate structure; compressing the first redistribution structure on the front surface of the substrate structure such that the at least a portion of the first redistribution conductor that is exposed is electrically connected by the first conductive particles to the at least a portion of the connection terminal or the at least a portion of the vertical connection conductor that is exposed; attaching a second anisotropic conductive film including second conductive particles to the rear surface of the substrate structure; and compressing the second redistribution structure on the rear surface of the substrate structure such that the at least a portion of the second redistribution conductor that is exposed is electrically connected by the second conductive particles to the vertical connection conductor.

According to an aspect of one or more example embodiments, there is provided a method comprising forming a substrate structure including a vertical connection conductor and a semiconductor chip; forming a first redistribution structure including a first redistribution conductor; forming a second redistribution structure including a second redistribution conductor; and compressing the first redistribution structure and the second redistribution structure on a front surface and a rear surface of the substrate structure, respectively, using anisotropic conductive films including conductive particles, wherein the forming the substrate structure, the forming the first redistribution structure, and the forming the second redistribution structure are performed independently and separately, wherein the first redistribution conductor is electrically connected to the vertical connection conductor and the semiconductor chip by the conductive particles, and wherein the second redistribution conductor is electrically connected to the vertical connection conductor by the conductive particles.

According to an aspect of one or more example embodiments, there is provided a method comprising forming a substrate structure including a substrate including at least one through-hole and a vertical connection conductor disposed around the at least one through-hole, at least one semiconductor chip disposed in the at least one through-hole and having a connection terminal, and an encapsulant filling the at least one through-hole, the substrate structure having a front surface at which at least a portion of each of the connection terminal and the vertical connection conductor is exposed, and a rear surface disposed opposite to the front surface; forming a first redistribution structure including a first redistribution conductor and having a first surface to which at least a portion of the first redistribution conductor is exposed; forming a second redistribution structure including a second redistribution conductor and having a second surface to which at least a portion of the second redistribution conductor is exposed; attaching a first anisotropic conductive film including first conductive particles to the front surface of the substrate structure; compressing the first redistribution structure to the front surface of the substrate structure such that the at least a portion of the first redistribution conductor that is exposed is electrically connected by the first conductive particles to the at least a portion of the connection terminal or the at least a portion of the vertical connection conductor that is exposed; attaching a second anisotropic conductive film including second conductive particles to the rear surface of the substrate structure; and compressing the second redistribution structure on the rear surface of the substrate structure such that the at least a portion of the second redistribution conductor that is exposed is electrically connected by the second conductive particles to the vertical connection conductor.

According to an aspect of one or more example embodiments, there is provided a semiconductor package comprising a semiconductor chip having a connection terminal; a vertical connection conductor disposed around the semiconductor chip; an encapsulant encapsulating at least a portion of the semiconductor chip and the vertical connection conductor and having a front surface to which at least a portion of each of the connection terminal and the vertical connection conductor is exposed and a rear surface disposed opposite to the front surface; a first redistribution structure disposed on the front surface and including a first redistribution conductor electrically connected to the connection terminal and the vertical connection conductor; a second redistribution structure disposed on the rear surface and including a second redistribution conductor electrically connected to the vertical connection conductor; a first anisotropic conductive film disposed between the front surface and the first redistribution structure and including first conductive particles; and a second anisotropic conductive film disposed between the rear surface and the second redistribution structure and including second conductive particles, wherein the first redistribution conductor is electrically connected by the first conductive particles to the at least a portion of the connection terminal or the at least a portion of the vertical connection conductor, and wherein the second redistribution conductor is electrically connected by the second conductive particles to the vertical connection conductor.

BRIEF DESCRIPTION OF DRAWINGS

The above and other aspects will be more clearly understood from the following detailed description, taken in conjunction with the accompanying drawings, in which:

FIGS. 3A to 3E are cross-sectional diagrams illustrating processes of manufacturing the first redistribution structure illustrated in FIG. 2 in sequence, according to an example embodiment;

DETAILED DESCRIPTION

Hereinafter, various example embodiments will be described as follows with reference to the accompanying drawings.

Figure 1:
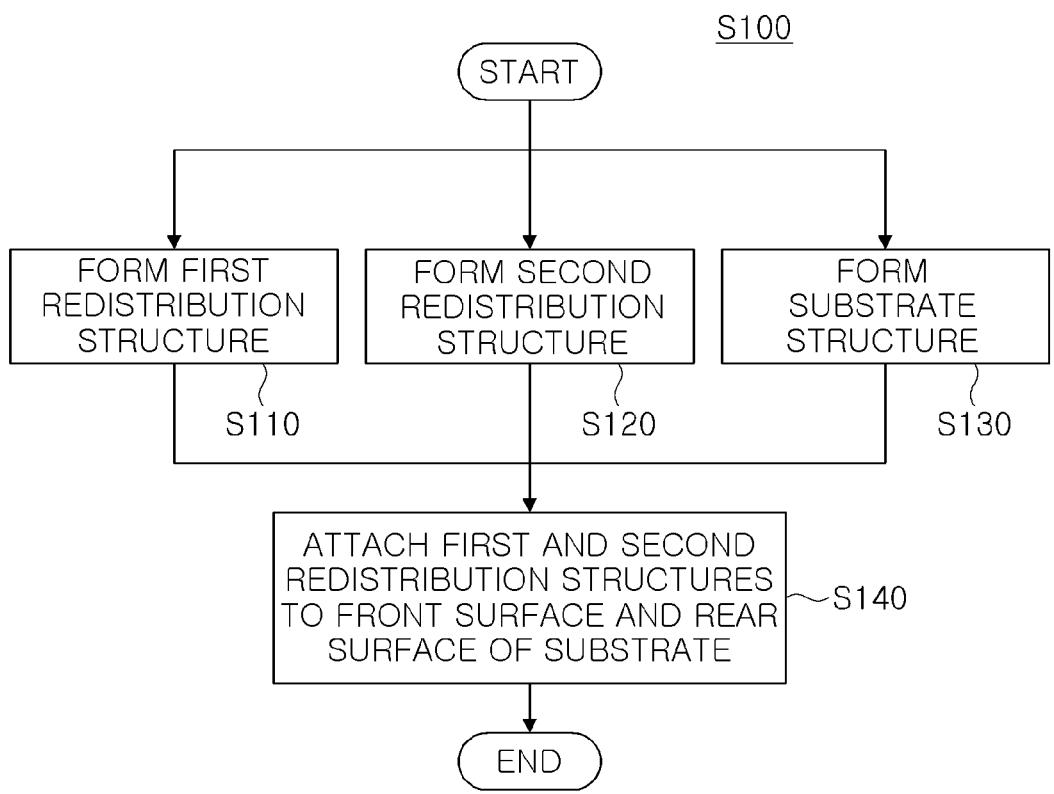
FIG. 1 is a plan diagram illustrating a method of manufacturing a semiconductor package according to an example embodiment.

FIG. 1 is a plan diagram illustrating a method of manufacturing a semiconductor package (S100) according to an example embodiment.

Referring to FIG. 1, the method of manufacturing a semiconductor package (S100) may include forming a first redistribution structure (S110), forming a second redistribution structure (S120), forming a substrate structure (S130), and attaching the first and second redistribution structures to the front and rear surfaces of the substrate structure (S140), respectively. The forming the substrate structure (S130), the forming the first redistribution structure (S110), and the forming the second redistribution structure (S120) may be independently and separately performed. That is, in some embodiments, the forming the substrate structure (S130), the forming the first redistribution structure (S110), and the forming the second redistribution structure (S120) may be performed in parallel. The independently and separately manufactured first and second redistribution structures may be coupled to the front and rear surfaces of the substrate structure, respectively, so as to be electrically connected to a semiconductor chip and/or a vertical connection conductor of the substrate structure, thereby manufacturing a semiconductor package. The semiconductor package may be a package-on-package (POP).

A lower package of a package-on-package (POP) structure according to the related art may include a first redistribution conductor for connecting to a main substrate and a second redistribution conductor for electrically connecting to an upper package. Since the first and second redistribution conductors include redistribution layers and redistribution vias having a fine pitch, when the first and second redistribution conductors are formed in sequence (i.e., first the first redistribution conductor is formed and then the second redistribution conductor is formed on the first redistribution conductor), together with the substrate structure on which the semiconductor chip is molded, a considerable period of turnaround time (TAT) may be consumed. Here, the turnaround time (TAT) may be a total time required for manufacturing a semiconductor package from a semiconductor wafer on which an integrated circuit is formed. Also, in this case, since warpage, process errors, thermal deformation, or the like, occur during the multilayer sequential stacking process, it may be difficult to form the second redistribution conductor that is formed relatively later with a fine pitch.

In various example embodiments, the first and second redistribution structures including the redistribution layer with a fine pitch and the substrate structure on which the semiconductor chip is molded may be manufactured in parallel in independent manufacturing processes as described with respect to FIG. 1, and the elements may be combined with each other to manufacture a semiconductor package, thereby reducing the turnaround time (TAT). Also, since the first and second redistribution structures are manufactured in independent manufacturing processes, the amount of distortion created during the multilayer stacking process may be reduced, and the first and second redistribution structures having the redistribution conductors and redistribution vias having a fine pitch may be manufactured. As described above, the turnaround time (TAT) may be a total time required for manufacturing a semiconductor package from a semiconductor wafer on which an integrated circuit is formed. Thus, by forming the first and second redistribution layers independently and separately, the TAT may be reduced.

The forming the first redistribution structure (S110) may include forming a front redistribution structure including redistribution conductors and redistribution vias having a fine pitch. The front redistribution structure may refer to a redistribution structure disposed adjacent to a main substrate when the semiconductor package is surface-mounted on the main substrate. For example, in the forming the first redistribution structure (S110), a first redistribution structure including at least one first insulating layer, and a first redistribution conductor disposed in at least one first insulating layer, and having a first surface to which at least a portion of the first redistribution conductor is exposed may be formed. This configuration will be described in greater detail with reference to FIGS. 2 to 3E.

The forming the second redistribution structure (S120) may include forming a rear redistribution structure including redistribution conductors and redistribution vias with a fine pitch. The rear redistribution structure may refer to a redistribution structure disposed opposite to the front redistribution structure adjacent to the main substrate when the semiconductor package is surface-mounted on the main substrate. For example, in the forming the second redistribution structure (S120), a second redistribution structure including at least one second insulating layer, and a second redistribution conductor disposed in at least one second insulating layer, and having a second surface to which at least a portion of the second redistribution conductor is exposed may be formed. This configuration will be described in greater detail with reference to FIGS. 4 to 5C.

The forming the substrate structure (S130) may include molding a vertical connection conductor and a semiconductor chip using an encapsulant. The substrate structure may refer to a semiconductor chip structure that is disposed between the first and second redistribution structures and that includes the semiconductor chip and the vertical connection conductor encapsulated by an insulating resin therein. For example, in the forming the substrate structure (S130), the substrate structure including the semiconductor chip having an active surface on which a connection terminal is disposed, the vertical connection conductor disposed around the semiconductor chip, and an encapsulant encapsulating at least a portion of the semiconductor chip and the vertical connection conductor, and having a front surface to which at least a portion of each of the connection terminal and the vertical connection conductor and a rear surface disposed opposite to the front surface, to which at least a portion of the vertical connection conductor is exposed. This configuration will be described in greater detail with reference to FIGS. 6 to 7D.

The attaching the first and second redistribution structures on the front and rear surfaces of the substrate structure (S140) may include attaching the first redistribution structure and the second redistribution structure on the on the front and rear surfaces of the substrate structure, respectively, using an anisotropic conductive film including conductive particles. That is, in some embodiments, the first redistribution structure may be attached to the front surface of the substrate structure using an anisotropic conductive film including conductive particles, and the second redistribution structure may be attached to the rear surface of the substrate structure using an anisotropic conductive film including conductive particles. The anisotropic conductive film may be an adhesive film in which microsized conductive particles are mixed in an insulating film. The anisotropic conductive film may have electrical conductivity in a compression direction and electrical insulation in a direction perpendicular to the compression direction when the anisotropic conductive film is disposed between the substrate structure and the first and second redistribution structures and is compressed. Also, resin included in the insulating film may have adhesiveness for attaching the substrate structure to the first and second redistribution structures. For example, when the substrate structure and the first and second redistribution structures are attached using the anisotropic conductive film, the first redistribution conductor of the first redistribution structure may be electrically connected to the vertical connection conductor and the semiconductor chip of the substrate structure by conductive particles, and the second redistribution conductor of the second redistribution structure may be electrically connected to the vertical connection conductor of the substrate structure by conductive particles. This configuration will be described in greater detail with reference to FIGS. 8 to 9F.

Figure 2:
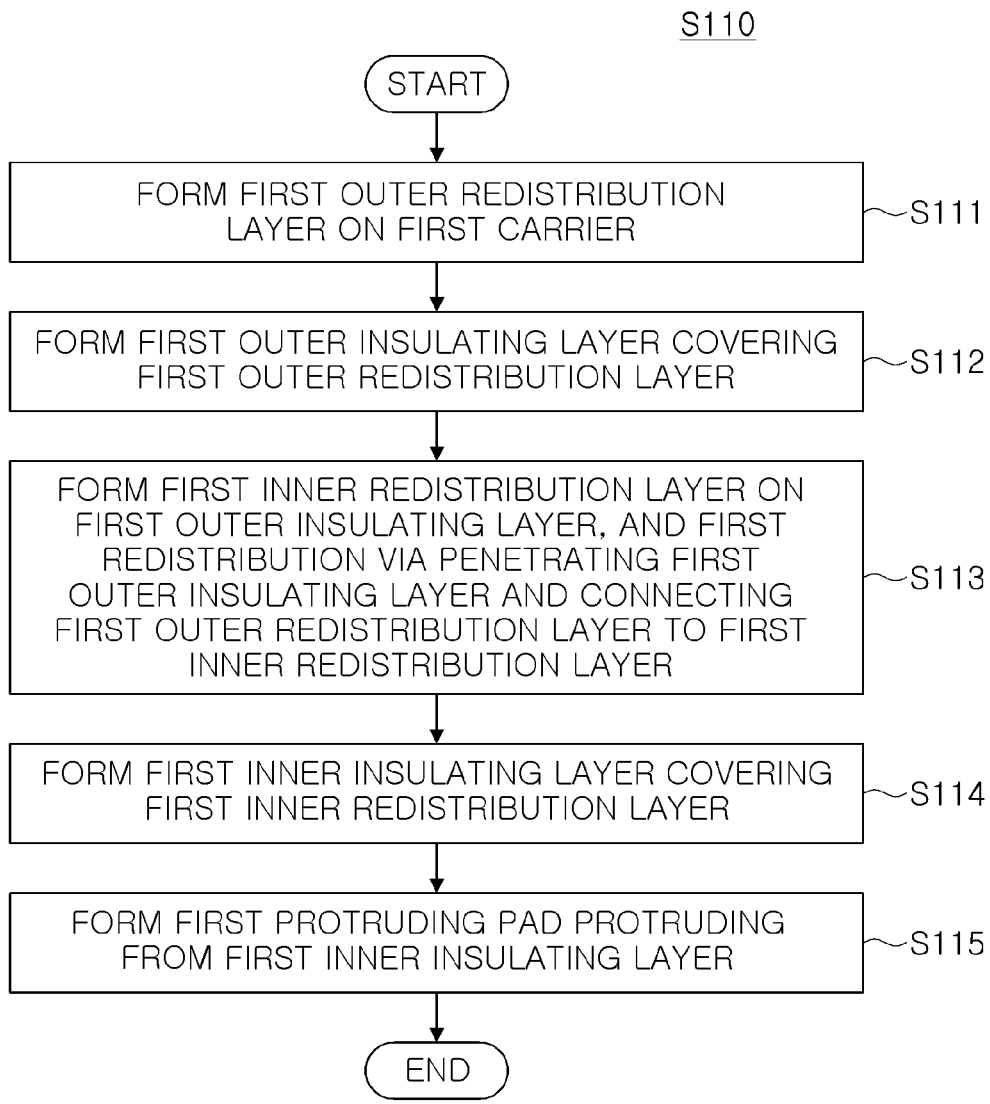
FIG. 2 is a flowchart illustrating processes of manufacturing a first redistribution structure according to an example embodiment.

FIG. 2 is a flowchart illustrating processes of manufacturing a first redistribution structure (S110) according to an example embodiment. FIGS. 3A to 3E are cross-sectional diagrams illustrating processes of manufacturing the first redistribution structure illustrated in FIG. 2 in sequence (S110).

Figure 3A:
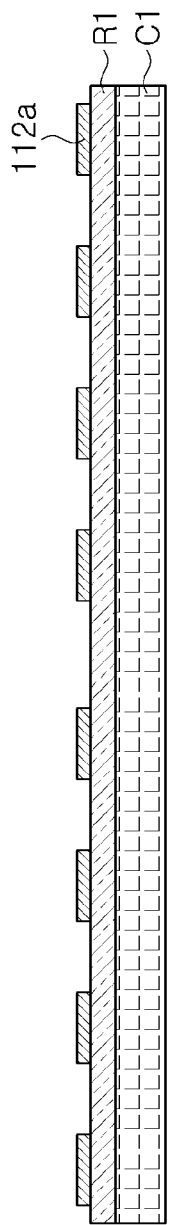
Figure 3B:
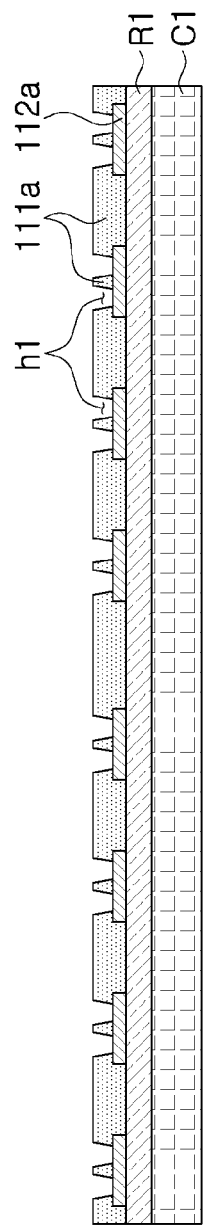
Figure 3C:
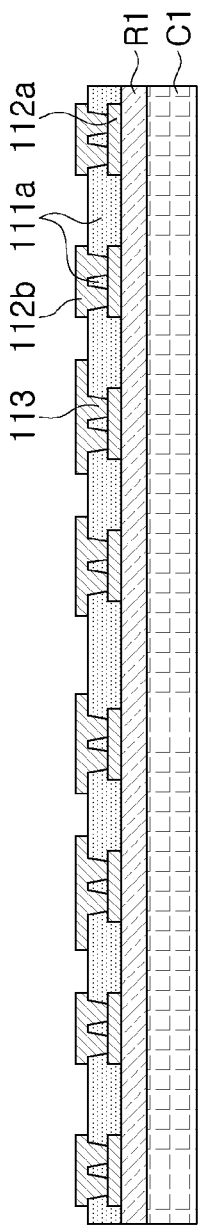

Referring to FIGS. 2 to 3E, the forming the first redistribution structure (S110) may include forming a first insulating layer 111 and a first redistribution conductor 115 in the first insulating layer 111. In an example embodiment, the forming the first redistribution structure (S110) may include forming a first outer redistribution layer 112a on a first carrier C1 (S111) (see FIG. 3A), forming a first outer insulating layer 111a covering the first outer redistribution layer 112a (S112) (see FIG. 3B), forming a first inner redistribution layer 112b on the first outer insulating layer 111a and a first redistribution via 113 penetrating the first outer insulating layer 111a and connecting the first outer redistribution layer 112a to a first inner redistribution layer 112b (S113) (see FIG. 3C), forming a first inner insulating layer 111b covering the first inner redistribution layer 112b (S114) (see FIG. 3D), and forming a first protruding pad 114 protruding from the first inner insulating layer 111b (S115) (see FIG. 3E). The first outer insulating layer 111a and the first inner insulating layer 111b may be included in the first insulating layer 111, and the first outer redistribution layer 112a, the first redistribution via 113, the first inner redistribution layer 112b and the first protruding pad 114 may be included in the first redistribution conductor 115.

Referring to FIG. 3A, first, a first outer redistribution layer 112a may be formed on a first carrier C1 (S111). For example, the first carrier C1 may include a copper clad laminate (CCL). A release layer R1 for peeling off the first carrier C1 may be disposed on an upper surface of the first carrier C1. The first outer redistribution layer 112a may be formed by forming a photoresist on a seed layer (not illustrated) formed by a process such as electroless plating or PVD, and performing an exposure process, a developing process, and a plating process thereon. The seed layer may be formed below the first outer redistribution layer 112a. The first outer redistribution layer 112a may include, for example, a metal material such as copper (Cu) or an alloy including the same, and may be referred to as under bump metallurgy (UBM). In an example embodiment, the first outer redistribution layer 112a may be configured to have a thickness greater than a thickness of the first inner redistribution layers 112b stacked thereon.

Referring to FIG. 3B, a first outer insulating layer 111a covering the first outer redistribution layer 112a and a via hole h1 penetrating the first outer insulating layer 111a may be formed (S112). The first outer insulating layer 111a may be formed by coating and curing an insulating resin on the first carrier C1. The insulating resin may include a thermosetting resin such as an epoxy resin, a thermoplastic resin such as a polyimide resin, a resin in which an inorganic filler and/or a glass fiber (or a glass cloth or a glass fabric) is impregnated in the thermosetting resin or the thermoplastic resin, such as prepreg, Ajinomoto build-up film (ABF), FR-4, bismaleimide triazine (BT), or the like. The first outer insulating layer 111a may be exposed externally of the manufactured semiconductor package and may protect the redistribution layers, such that the first outer insulating layer 111a may include a material having excellent physical properties such as durability and heat resistance. For example, the first outer insulating layer 111a may be formed using ABF. The via hole h1 may be formed by a photolithography process and/or an etching process. The photolithography process may include a series of processes including an exposure process, a developing process, and a cleaning process. In an example embodiment, a plurality of via holes h1 may be formed on a single first outer redistribution layer 112a to secure connection reliability of the first outer redistribution layer 112a, but example embodiments are not limited thereto. In other example embodiments, a single via hole may be formed.

Referring to FIG. 3C, the first inner redistribution layer 112b on the first outer insulating layer 111a and the first redistribution via 113 penetrating the first outer insulating layer 111a may be formed (S113). The first inner redistribution layer 112b and the first redistribution via 113 may be formed by performing a plating process. For example, a photoresist (not illustrated) may be coated on the first outer insulating layer 111a, and the photoresist may be patterned using a photolithography process. The patterned photoresist (not illustrated) may expose a portion of surfaces of the first outer insulating layer 111a in which the first inner redistribution layer 112b is formed, and the via hole h1 in which the first redistribution via 113 is formed. Before coating the photoresist (not illustrated), a seed layer (not illustrated) may be formed on the upper surface of the first outer insulating layer 111a and an inner wall of the via hole h1. A plating process may be performed using the patterned photoresist (not illustrated) and the seed layer (not illustrated). The first inner redistribution layer 112b and the first redistribution via 113 may include a metal material such as copper (Cu) or an alloy including the same.

Referring to FIG. 3D, the first inner insulating layer 111b covering the first inner redistribution layer 112b on the first outer insulating layer 111a, the first inner redistribution layer 112b on the first inner insulating layer 111b, and the first redistribution via 113 penetrating the first inner insulating layer 111b may be formed (S114). In an example embodiment, the first inner insulating layer 111b may be formed by coating and curing a photosensitive resin, such as, for example, photoimageable dielectric (PID), on the first outer insulating layer 111a. In this case, the first inner redistribution layer 112b on the first internal insulating layer 111b and the first redistribution via 113 penetrating the first internal insulating layer 111b may be implemented with a fine pitch.

Referring to FIG. 3E, by repeating the process in FIG. 3D, a plurality of first internal insulating layers 111b, a plurality of first inner redistribution layers 112b, and a plurality of first redistribution vias 113 may be formed. In example embodiments, the number of first internal insulating layer 111b, the number of the first inner redistribution layer 112b, and the number of the first redistribution via 113 may be greater than the example illustrated in FIGS. 3A-3E. Thereafter, the first protruding pad 114 protruding from the uppermost first inner insulating layer 111b may be formed (S115). In some example embodiments, the first carrier C1 may be removed. The first protruding pad 114 may be formed using a photolithography process, a plating process, or the like. The first protruding pad 114 may have a post or pillar shape, but example embodiments are not limited thereto. In some example embodiments, the first protruding pad 114 may be a landing pad formed on one end of the metal pattern extending along the upper surface of the uppermost first inner insulating layer 111b.

As described above, according to the process of manufacturing the first redistribution structure (S110) of the example embodiment, the first redistribution structure 110 including at least one first insulating layer 111, and the first redistribution conductor 115 disposed in the at least one first insulating layer 111, and having the first surface S1 to which at least a portion of the first redistribution conductor 115 is exposed may be formed. The first redistribution structure 110 may be electrically connected to the semiconductor chip and the vertical connection conductor of the substrate structure ('130' in FIG. 9C) through the first redistribution conductor 115 exposed on the first surface S1 (see FIGS. 9A to 9C). For example, a first anisotropic conductive film 140a (in FIG. 9B) including the first conductive particles 142 (in FIG. 9B) may be interposed between the first redistribution structure 110 and the substrate structure 130 (in FIG. 9B), and the first redistribution structure 110 may be attached to the front surface FS (in FIG. 9C) of the substrate structure 130 (in FIG. 9C) such that the first protruding pad 114 may be embedded in the first anisotropic conductive film 140a (in FIG. 9C). In the example embodiment, by independently manufacturing the first redistribution structure 110 and bonding the substrate structure to the first redistribution structure 110 using the anisotropic conductive film, the turnaround time (TAT) of the semiconductor package may be reduced, and the first redistribution structure 110 may be implemented with a fine pitch.

Figure 4:
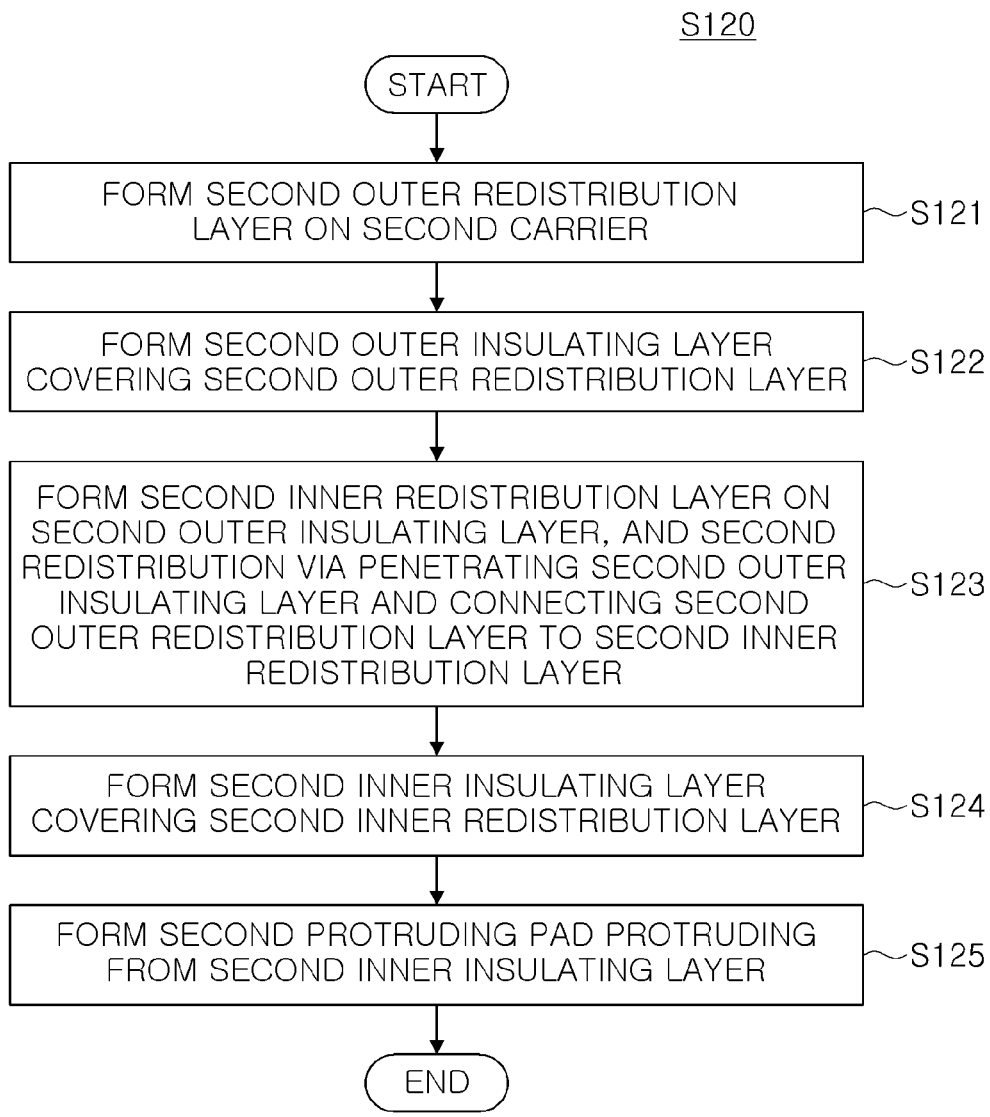
FIG. 4 is a flowchart illustrating processes of manufacturing a second redistribution structure according to an example embodiment.
Figure 5A:
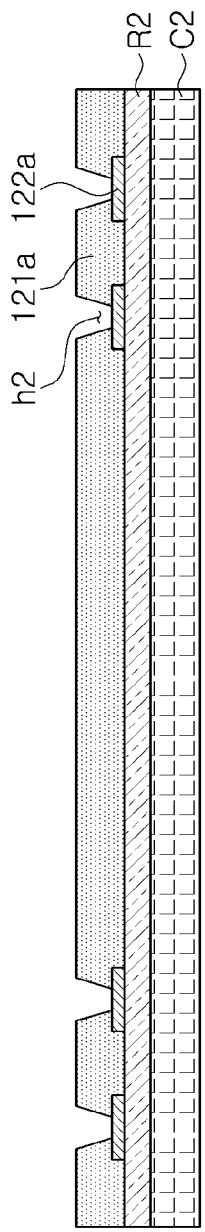
FIGS. 5A to 5C are cross-sectional diagrams illustrating processes of manufacturing the second redistribution structure illustrated in FIG. 4 in sequence, according to an example embodiment.
Figure 5B:
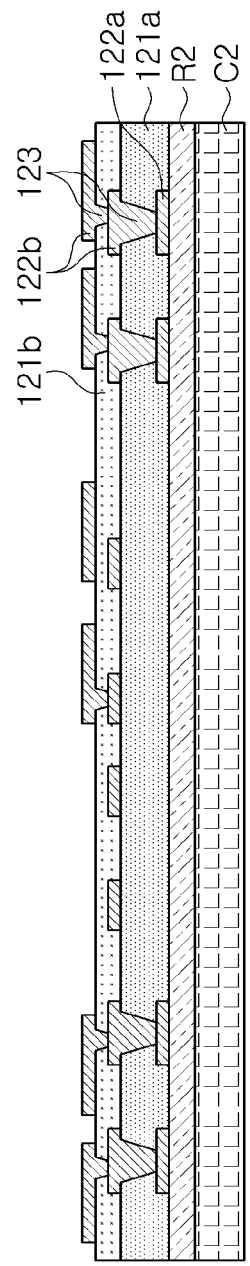

FIG. 4 is a flowchart illustrating processes of manufacturing a second redistribution structure (S120) according to an example embodiment. FIGS. 5A and 5B are cross-sectional diagrams illustrating processes of manufacturing the second redistribution structure (S120) illustrated in FIG. 4 in sequence.

Figure 5C:
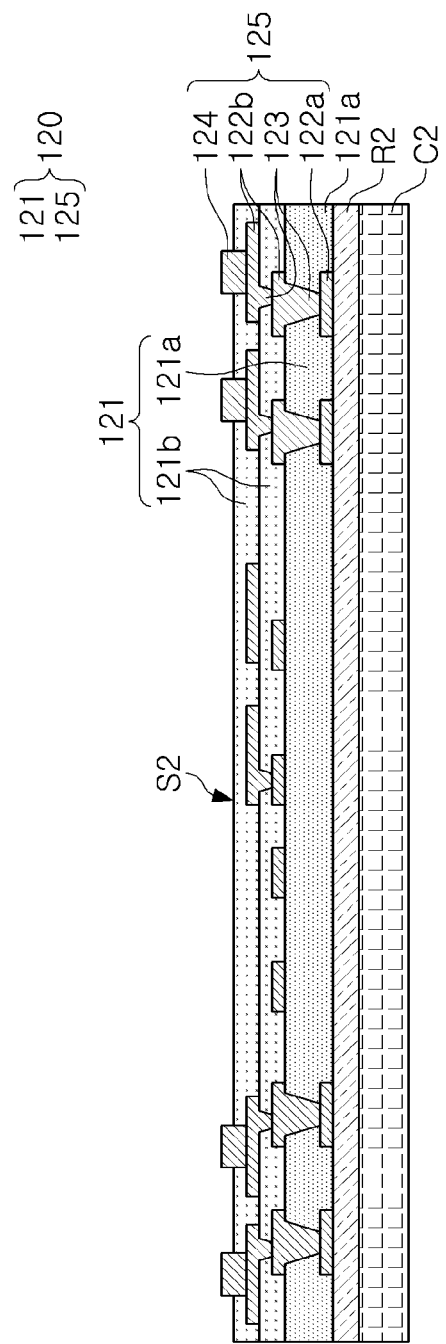

Referring to FIGS. 4 to 5C, the forming the second redistribution structure (S120) may include forming the second insulating layer 121 and the second redistribution conductor 125 in the second insulating layer 121. In an example embodiment, the forming the second redistribution structure (S120) may include forming a second outer redistribution layer 122a on a second carrier C2 (S121) (see FIG. 5A), forming a second outer insulating layer 121a covering the second outer redistribution layer 122a (S122) (see FIG. 5A), forming a second inner redistribution layer 122b on the second outer insulating layer 121a, and a second redistribution via 123 penetrating the second outer insulating layer 121a and connecting the second outer redistribution layer 122a to the second inner redistribution layer 122b (S123) (see FIG. 5B), forming a second internal insulating layer 121b covering the second inner redistribution layer 122b (S124) (see FIG. 5C), and forming the second protruding pad 124 protruding from the second inner insulating layer 121b (S125) (see FIG. 5C). The second outer insulating layer 121a and the second inner insulating layer 121b may be included in the second insulating layer 121, and the second outer redistribution layer 122a, the second redistribution via 123, the second inner redistribution layer 122b and the second protruding pad 124 may be included in the second redistribution conductor 125.

Referring to FIG. 5A, the second outer redistribution layer 122a may be formed on the second carrier C2 (S121), and the second outer insulating layer 121a covering the second outer redistribution layer 122a, and a via hole h2 penetrating the second outer insulating layer 121a may be formed (S122). For example, the second carrier C2 may be a copper clad laminate (CCL), and a release layer R2 may be disposed on the upper surface of the second carrier C2. The second outer redistribution layer 122a may be formed by forming a photoresist on a seed layer (not illustrated) formed by a process such as electroless plating or PVD, and performing an exposure process, a developing process, and a plating process thereon. The second outer insulating layer 121a may be formed by coating and curing an insulating resin on the second carrier C2. The insulating resin may include a thermosetting resin such as an epoxy resin, a thermoplastic resin such as a polyimide resin, an insulating material in which the thermosetting resin or the thermoplastic resin is impregnated in a core material such as an inorganic filler and/or a glass fiber (or a glass cloth or a glass fabric), such as prepreg, ABF, FR-4, and BT. Since the second outer insulating layer 121a is exposed externally of the manufactured semiconductor package and may protect the redistribution layers, the second outer insulating layer 121a may include a material having excellent physical properties such as durability and heat resistance. For example, the second outer insulating layer 121a may be formed using ABF. The via hole h2 may be formed by a photolithography process and/or an etching process.

Referring to FIG. 5B, the second inner redistribution layer 122b on the second outer insulating layer 121a and the second redistribution via 123 penetrating the second outer insulating layer 121a may be formed (S123). The second inner insulating layer 121b covering the second inner redistribution layer 122b may be formed on the second outer insulating layer 121a and the second inner redistribution layer 122b, and the second inner redistribution layer 122b and the second redistribution via 123 (i.e., another second inner redistribution layer and another second redistribution via (for multiple layers)) on the second inner insulating layer 121b may be formed (S124). The second inner redistribution layer 122b and the second redistribution via 123 may be formed by performing a plating process. In an example embodiment, the second inner insulating layer 121b may be formed by coating and curing a photosensitive resin, such as, for example, PID, on the second outer insulating layer 121a. In this case, the second inner redistribution layer 122b on the second internal insulating layer 121b and the second redistribution vias 123 penetrating the second internal insulating layer 121b may be implemented with a fine pitch. Also, in an example embodiment, since the second redistribution structure 120 is formed in an independent manufacturing process, the amount of distortion created during the multi-layer stacking process may be reduced, and the second redistribution structure 120 including the second redistribution conductor 125 having a fine pitch may be manufactured.

Referring to FIG. 5C, a second protruding pad 124 protruding from an uppermost second inner insulating layer 121b may be formed (S125). In some example embodiments, the second carrier C2 may be removed. The second protruding pad 124 may be formed using a photolithography process, a plating process, or the like. The second protruding pad 124 may have a post shape or pillar shape, but example embodiments are not limited thereto. In some example embodiments, the second protruding pad 124 may be a landing pad formed on one end of the metal pattern extending along the upper surface of the uppermost second inner insulating layer 121b. In example embodiments, the number of the second inner insulating layer 121b, the number of the second inner redistribution layer 122b, and the number of the second redistribution via 123 may be greater than the example illustrated in FIGS. 5A-5C.

As described above, by performing the process of manufacturing the second redistribution structure (S120) of the example embodiment, the second redistribution structure 120 including at least one second insulating layer 121, and the second redistribution conductor disposed in the at least one second insulating layer 121, and having a second surface S2 to which at least a portion 124 of the second redistribution conductor 125 is exposed may be formed. The second redistribution structure 120 may be electrically connected to the semiconductor chip and the vertical connection conductor of the substrate structure 130 (in FIG. 9F) through the second redistribution conductor 125 exposed on the second surface S2 (see FIGS. 9D to 9F). For example, the second anisotropic conductive film 140b (in FIG. 9E) including second conductive particles 144 (in FIG. 9E) may be interposed between the second redistribution structure 120 and the substrate structure 130 (in FIG. 9E), and the second redistribution structure 120 may be attached to a rear surface of the substrate structure such that the second protruding pad 124 may be embedded in the second anisotropic conductive film 140b (in FIG. 9F). In the example embodiment, by independently manufacturing the second redistribution structure 120 and bonding the substrate structure to the second redistribution structure 120 using an anisotropic conductive film, the turnaround time (TAT) of the semiconductor package may be reduced, and a fine pitch of the second redistribution structure 120 may be implemented.

Figure 6:
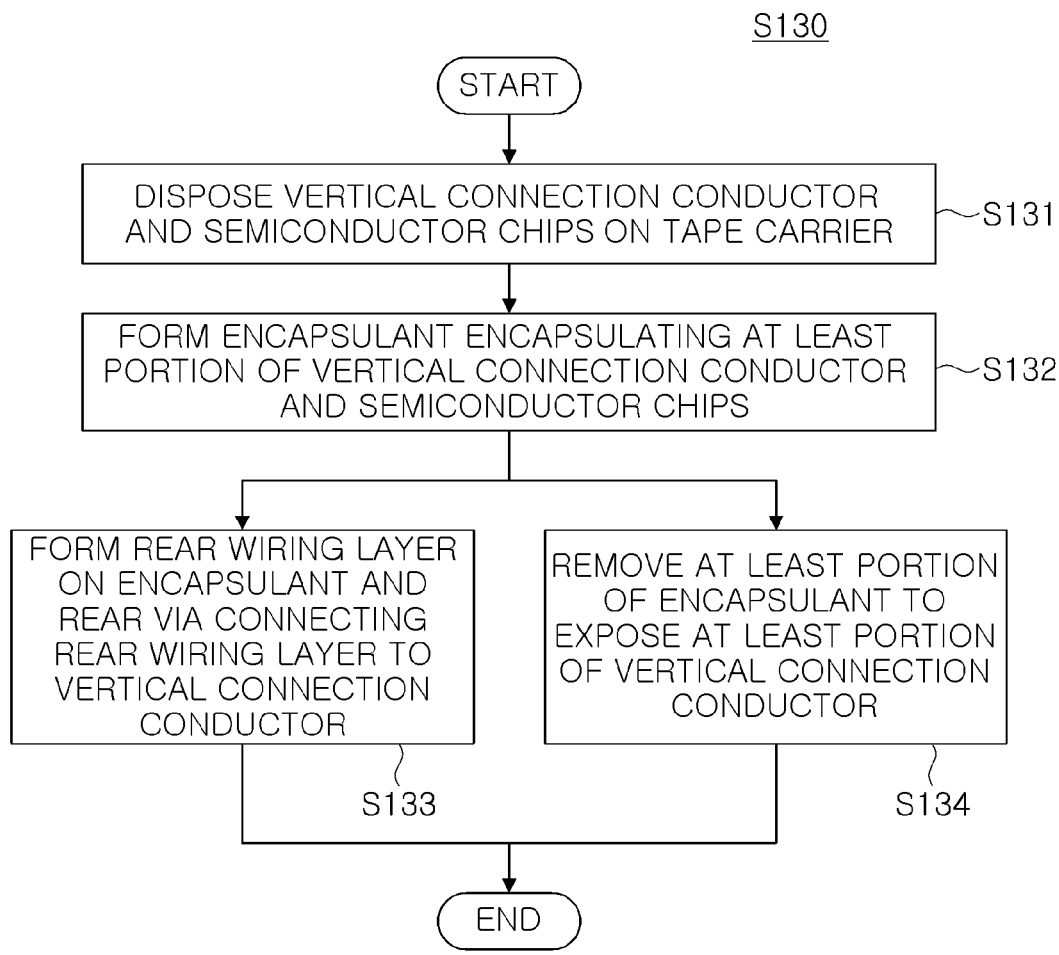
FIG. 6 is a flowchart illustrating processes of manufacturing a substrate structure according to an example embodiment.

FIG. 6 is a flowchart illustrating processes of manufacturing a substrate structure (S130) according to an example embodiment. FIGS. 7A to 7D are cross-sectional diagrams illustrating processes of manufacturing the substrate structure (S130) illustrated in FIG. 6 in sequence.

Figure 7A:
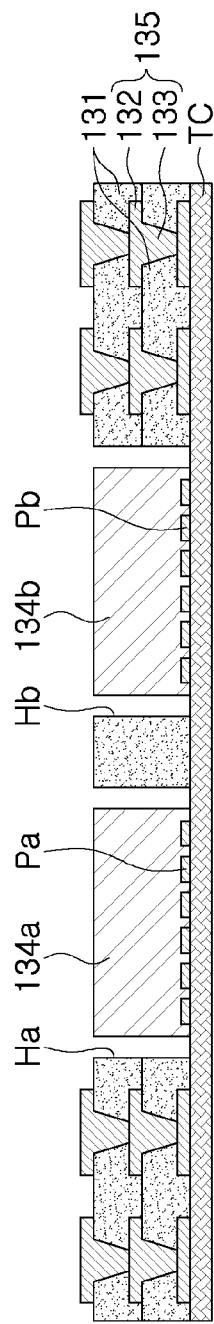
FIGS. 7A to 7D are cross-sectional diagrams illustrating processes of manufacturing the substrate structure illustrated in FIG. 6 in sequence, according to an example embodiment.
Figure 7B:
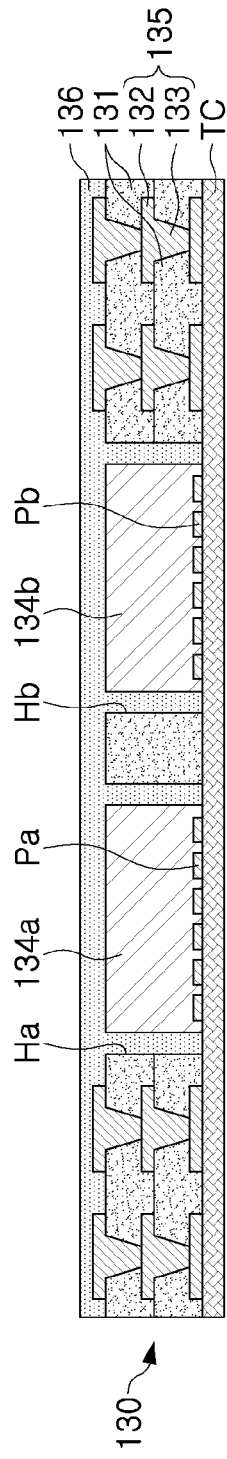

Referring to FIGS. 6 to 7B, forming the substrate structure 130 (S130) may include encapsulating semiconductor chips 134a and 134b and a vertical connection conductor 135 using an encapsulant 136. In an example embodiment, the forming the substrate structure 130 (S130) may include disposing the vertical connection conductor 135 and the semiconductor chips 134a and 134b on a tape carrier TC (S131) (FIG. 7A), and forming the encapsulant 136 encapsulating at least a portion of the vertical connection conductor 135 and the semiconductor chips 134a and 134b(S132) (see FIG. 7B), and forming a rear wiring layer 138 on the encapsulant 136, and a rear via 137 connecting the rear wiring layer 138 to the vertical connection conductor 135 (S133) (see FIG. 7C) or removing at least a portion 135T the encapsulant 136 to expose at least a portion of the vertical connection conductor 135 (S134) (see FIG. 7D).

Referring back to FIG. 7A, the vertical connection conductor 135 and the semiconductor chips 134a and 134b may be disposed on the tape carrier TC (S131). The tape carrier TC may fasten and support the vertical connection conductor 135 and the semiconductor chips 134a and 134b, and may include, for example, an adhesive tape losing adhesiveness by ultraviolet (UV) irradiation. While the example embodiment in FIGS. 7A-7D illustrates two semiconductor chips 134a and 134b, example embodiments are not limited thereto. In some example embodiments, the number of semiconductor chips may be one or more than two. That is, at least one semiconductor chip 134a and 134b, and a plurality of vertical connection conductors 135 to surround the at least one semiconductor chip 134a and 134b may be disposed on the tape carrier TC.

The semiconductor chips 134a and 134b may each have an active surface on which connection terminals Pa and Pb, respectively, are disposed, and an inactive surface disposed opposite to the active surface. For example, the semiconductor chips 134a and 134b may be disposed such that an active surface may face the tape carrier TC. The semiconductor chips 134a and 134b may include a logic chip and/or a memory chip. A logic chip may include, for example, a central processing unit (CPU), a graphics processing unit (GPU), a field programmable gate array (FPGA), a digital signal processing unit (DSP), a cryptographic processor, a microprocessor, a microcontroller, an analog-to-digital converter, an application-specific integrated circuit (ASIC), and the like. The memory chip may include, for example, a volatile memory device such as a dynamic RAM (DRAM), a static RAM (SRAM), or a non-volatile memory device such as a phase change RAM (PRAM), a magnetic RAM (MRAM), a resistive RAM (RRAM), and a flash memory. For example, a first semiconductor chip 134a and a second semiconductor chip 134b may be disposed on the tape carrier TC, the first semiconductor chip 134a may include an application processor (AP) chip, and a second semiconductor chip 134b may include a power management integrated circuit (PMIC) chip.

The vertical connection conductor 135 may extend in a thickness direction of the semiconductor chips 134a and 134b and may provide an electrical path in a vertical direction in the substrate structure 130. For example, the vertical connection conductor 135 may include a plurality of wiring layers 132 and a plurality of vias 133 stacked in a vertical direction in the substrate 131. The substrate 131 may be formed of an insulating material, such as, for example, a thermosetting resin such as an epoxy resin, a thermoplastic resin such as a polyimide resin, a resin mixed with the above mentioned resins, such as ABF. Alternatively, a material in which the above-described resin is impregnated into glass fiber, glass cloth, glass fabric together with an inorganic filler, such as, for example, a prepreg may be used. The substrate 131 may include a plurality of layers as illustrated in FIGS. 7A-7D, but example embodiments are not limited thereto. In some example embodiments, the substrate 131 may be a single layer. The substrate 131 may have at least one through-hole Ha and Hb for accommodating at least one semiconductor chip 134a and 134b, respectively. While the example embodiment in FIGS. 7A-7D illustrates two through-holes Ha and Hb, example embodiments are not limited thereto. In some example embodiments, the number of through-holes may be one or more than two. The first and second semiconductor chips 134a and 134b may be disposed respectively in the first and second through-holes Ha and Hb separated from each other as illustrated in FIGS. 7A-7D, but example embodiments are not limited thereto and, in some example embodiments, the first and second semiconductor chips 134a and 134b may be disposed in a single through-hole. The substrate 131 may improve rigidity of the substrate structure 130 and thickness uniformity of the encapsulant 136 formed thereafter. The vertical connection conductor 135 may be formed on the insulating material included in the substrate 131 using an etching process, a plating process, or the like. The vertical connection conductor 135 may include, for example, a metal material such as copper (Cu) or an alloy including the same. However, the vertical connection conductor 135 applied to the example embodiments is not limited to the shape illustrated in the drawings. In example embodiments, the vertical connection conductor 135 may have a post shape directly penetrating the encapsulant 136 (in FIG. 7B).

Referring to FIG. 7B, an encapsulant 136 encapsulating at least a portion of the semiconductor chips 134a and 134b and the vertical connection conductor 135 may be formed (S132). For example, the encapsulant 136 may fill the first through-hole Ha and the second through-hole Hb in which the first semiconductor chip 134a and the second semiconductor chip 134b are accommodated, and may cover upper portions of the first and second semiconductors chips 134a and 134b and the vertical connection conductor 135. The encapsulant 136 may be formed by coating and curing an insulating material on the tape carrier TC. The encapsulant 136 may include, for example, a thermosetting resin such as an epoxy resin, a thermoplastic resin such as polyimide, or prepreg, ABF, FR-4, BT, and EMC including inorganic filler and/or glass fiber.

Figure 7C:
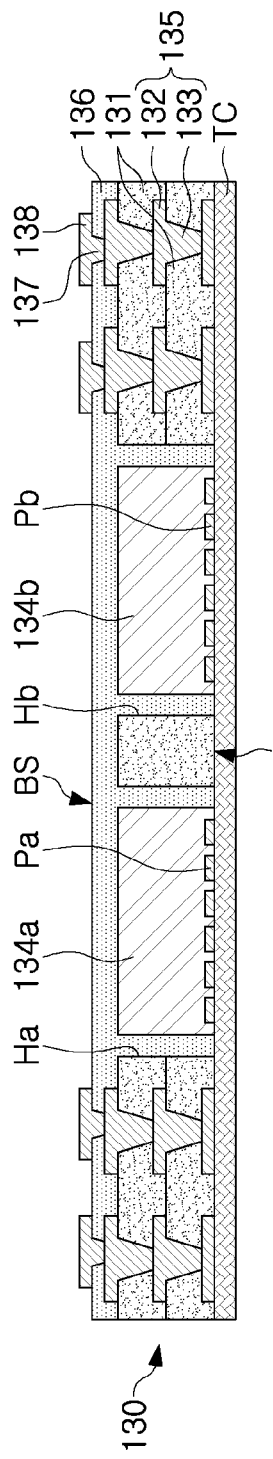
Figure 7D:
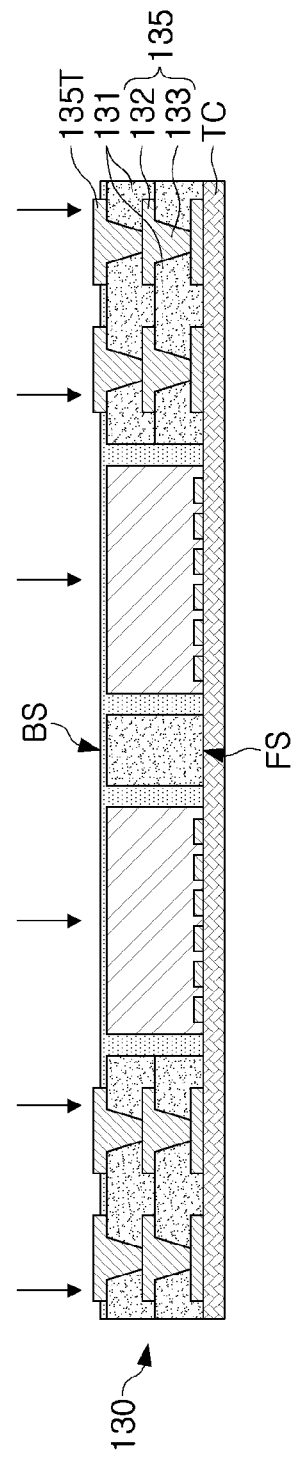

Thereafter, the substrate structure 130 may be manufactured by selectively performing the processes in FIG. 7C or 7D.

Referring to FIG. 7C, the forming the substrate structure (S130) may further include forming a rear wiring layer 138 on the encapsulant 136, and a rear via 137 penetrating the encapsulant 136 covering an upper portion of the vertical connection conductor 135 and connecting the rear wiring layer 138 to the vertical connection conductor 135 (S133). The rear wiring layer 138 and the rear via 137 may be formed on the encapsulant 136 using an etching process, a plating process, or the like, and for example, a metal material such as copper (Cu) or an alloy including the same. In this case, the substrate structure 130 may have a rear surface BS on which the rear wiring layer 138 is disposed, and a front surface FS on which at least a portion of connection terminals Pa and Pb of the semiconductor chips 134a and 134b and the vertical connection conductor 135 are exposed (i.e., after removal of tape carrier TC). Thereafter, the rear wiring layer 138 may be embedded in the anisotropic conductive film, thereby being electrically connected to the second redistribution structure 120 disposed on the rear surface BS of the substrate structure 130 (see FIGS. 9D to 9F).

Referring to FIG. 7D, the forming the substrate structure (S130) may further include removing a portion of the encapsulant 136 covering the upper portion of the vertical connection conductor 135 such that at least a portion 135T of the vertical connection conductor 135 is exposed on the rear surface BS of the substrate structure 130 (S134). In some example embodiments, the tape carrier TC may be removed. A portion of the encapsulant 136 may be removed by performing a planarization process, for example, a chemical mechanical polishing (CMP) process, a laser ablation (LA) process, or the like. For example, using the LA process, the encapsulant 136 may be planarized such that the upper portion 135T of the vertical connection conductor 135 may protrude to the upper surface of the encapsulant 136. In example embodiments, the encapsulant 136 may be planarized using a CMP process such that the upper surface of the encapsulant 136 and the upper surface of the vertical connection conductor 135 may become coplanar with each other (see the example embodiment in FIG. 12). In this case, the substrate structure 130 may include the rear surface BS to which at least a portion of the vertical connection conductor 135 is exposed (or protrudes) and the front surface FS to which at least a portion of the connection terminals Pa and Pb of the semiconductor chips 134a and 134b and the vertical connection conductor 135 is exposed (i.e., after removal of tape carrier TC). Thereafter, the upper portion 135T of the vertical connection conductor 135 exposed on the rear surface BS may be compressed to the anisotropic conductive film, and may be electrically connected to the second redistribution structure 120 disposed on the rear surface BS of the substrate structure 130.

As such, by performing the process of manufacturing the substrate structure (S130) of the example embodiment, the substrate structure 130 including the semiconductor chips 134a and 134b having the active surface on which the connection terminals Pa and Pb are disposed, the vertical connection conductor 135 disposed around the semiconductor chips 134a and 134b, and the encapsulant 136 encapsulating at least a portion of the semiconductor chips 134a and 134b and the connection conductor 135, and having the front surface FS on which at least a portion of each of the connection terminals Pa and Pb and the vertical connection conductor 135, and the rear surface BS disposed opposite to the front surface FS may be formed. The substrate structure 130 may be electrically connected to the first redistribution structure 110 (in FIG. 9C) through the connection terminals Pa and Pb and the vertical connection conductor 135 exposed on the front surface FS, and may be electrically connected to the second redistribution structure 120 (in FIG. 9F) through the rear wiring layer 138 on the BS or the vertical connection conductor 135 exposed on the rear surface BS.

In the example embodiment, by independently and separately manufacturing the substrate structure 130 from the first and second redistribution structures 110 and 120, and coupling the substrate structure 130 to the first and second redistribution structures 110 and 120 using an anisotropic conductive film, The turnaround time (TAT) of the semiconductor package may be shortened, and fine pitches of the first and second redistribution structures 110 and 120 may be implemented.

Figure 8:
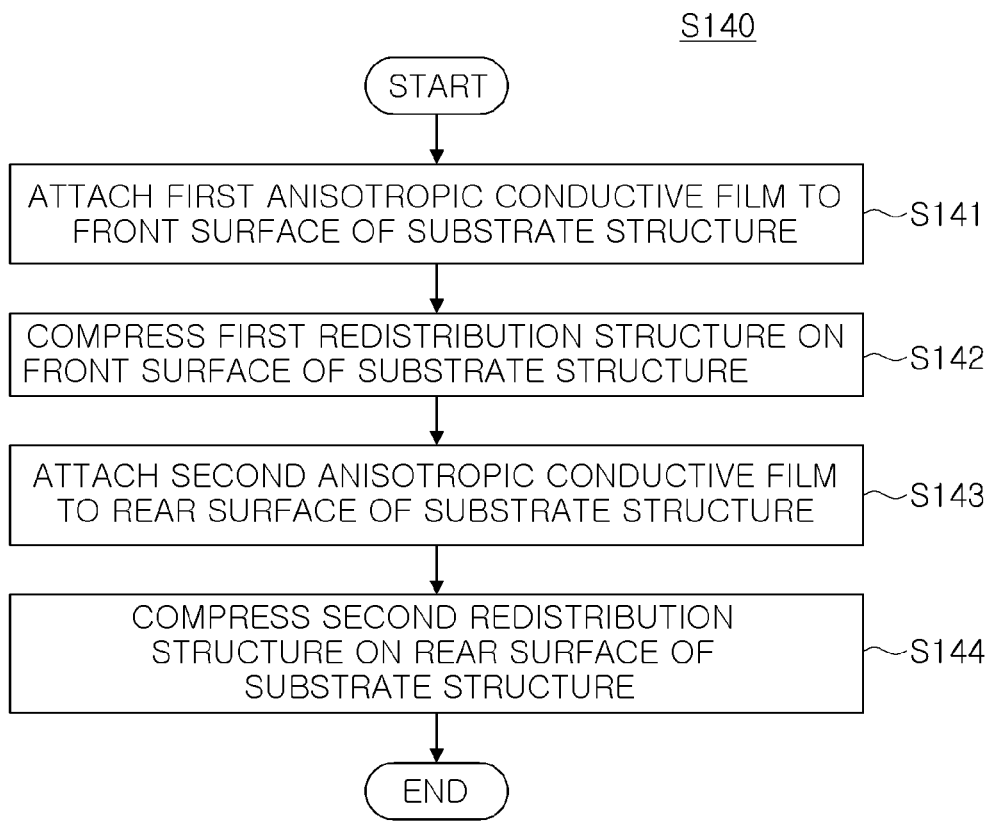
FIG. 8 is a flowchart illustrating processes of attaching first and second redistribution structures according to an example embodiment.

FIG. 8 is a flowchart illustrating processes of attaching the substrate structure 130 and the first and second redistribution structures (S140) according to an example embodiment. FIGS. 9A to 9F are cross-sectional diagrams illustrating the processes of attaching the substrate structure 130 and the first and second redistribution structures illustrated in FIG. 8. FIGS. 8 to 9F are diagrams illustrating a process S140 of attaching the first and second redistribution structures 110 and 120 to the front and rear surfaces of the substrate structure 130 (S140).

Referring to FIGS. 8 to 9F, the attaching the first and second redistribution structures 110 and 120 to the front surface FS and the rear surface BS of the substrate structure 130 (S140) may include interposing anisotropic conductive films 140a and 140b between the substrate structure 130 and the first and second redistribution structures 110 and 120, respectively, and physically and electrically connecting the elements to each other by compressing the elements at a high temperature. In an example embodiment, the attaching the substrate structure 130 and the first and second redistribution structures 110 and 120 (S140) may include attaching the first anisotropic conductive film 140a to the front surface FS of the substrate structure 130 (S141) (see FIG. 9A), compressing the first redistribution structure 110 on the front surface FS of the substrate structure 130 (S142) (see FIGS. 9B and 9C), attaching the second anisotropic conductive film 140b to the rear surface BS of the substrate structure 130 (S143) (see FIG. 9d), and compressing the second redistribution structure 120 to the rear surface BS of the substrate structure 130 (S144) (see FIGS. 9E and 9F).

The compressing the first redistribution structure 110 (S142) and the compressing the second redistribution structure 120 (S144) may be performed by, for example, thermocompression bonding or thermosonic bonding. For example, the processes S142 and S144 described above may be performed in a temperature range of about 100° C. to about 300° C., about 200° C. to about 300° C., or about 250° C. to about 300° C.

The first and second anisotropic conductive films 140a and 140b may include respectively insulating resins 141 and 143 and first and second conductive particles 142 and 144 dispersed in the insulating resins 141 and 143. The first and second anisotropic conductive films 140a and 140b are not limited to any particular material, and may have a thickness in a range of about 5 µm to about 50 µm, about 5 µm to about 40 µm, or about 10 µm to about 30 µm. The insulating resins 141 and 143 may include a thermosetting resin, a thermoplastic resin, or a mixture thereof. For example, the insulating resins 141 and 143 may include at least one of epoxy resin, polyurethane, acrylic resin, polyethylene, silicone polymer, styrene butadiene block copolymer, or styrene-ethylene-propylene-styrene block copolymer.

The first and second conductive particles 142 and 144 may have a form in which a conductive material is coated on the surface of the core particle. The core particle may be, for example, a plastic ball having a diameter in the range of about 1 µm to about 50 µm, about 2 µm to about 40 µm, or about 3 µm to about 30 µm. However, example embodiments are not limited thereto and, in some example embodiments, the core particles may be conductive particles such as carbon fibers or metal balls. The conductive material coated on the surface of the core particle may include, for example, a metal material such as gold (Au), silver (Ag), nickel (Ni), or lead (Pd). Also, the surface of the conductive material, that is, the outermost region of the conductive particles 142 and 144 may be coated with an insulating skin layer. Accordingly, electrical conductivity may appear in the compression direction by the conductive particles 142 and 144 in which the epidermal layer is destroyed by high-temperature compression.

Referring back to FIG. 9A, the first anisotropic conductive film 140a including the first conductive particles 142 may be attached to the front surface FS of the substrate structure 130 (S141). For example, in some example embodiments, the tape carrier TC may be removed from the substrate structure 130, and the first anisotropic conductive film 140a including the first conductive particles 142 may be attached to the front surface FS of the substrate structure 130. The first anisotropic conductive film 140a may be an adhesive film in which a plurality of first conductive particles 142 are dispersed in the insulating resin 141. The connection terminals Pa and Pb of the semiconductor chips 134a and 134b and the vertical connection conductor 135 around the terminals may be exposed on the front surface FS of the substrate structure 130, and the first anisotropic conductive film 140a may be attached to the front surface FS of the substrate structure 130 so as to be in direct contact with the connection terminals Pa and Pb and the vertical connection conductor 135. Since the insulating resin 141 and the first conductive particles 142 have the same characteristics as described above, overlapping descriptions will not be provided for conciseness.

Figure 9A:
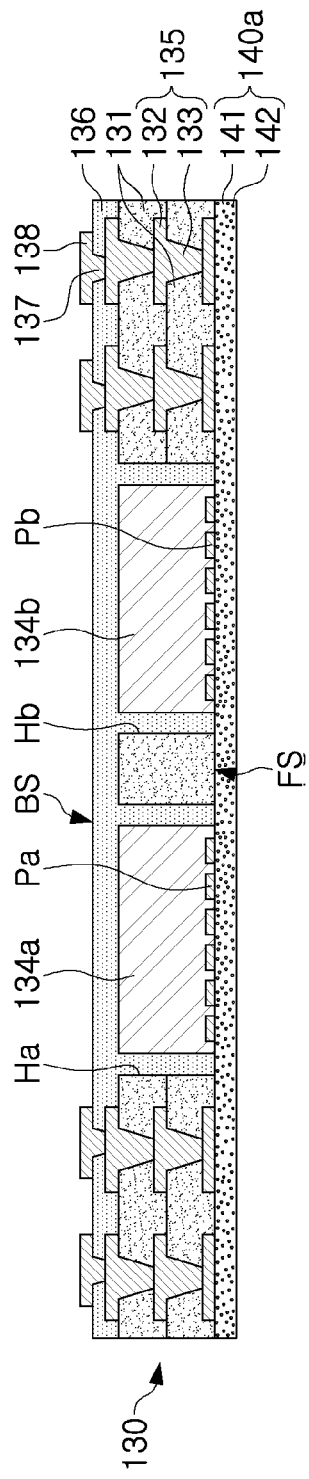
FIGS. 9A to 9F are cross-sectional diagrams illustrating processes of attaching the first and second redistribution structures illustrated in FIG. 8, according to an example embodiment.
Figure 9B:
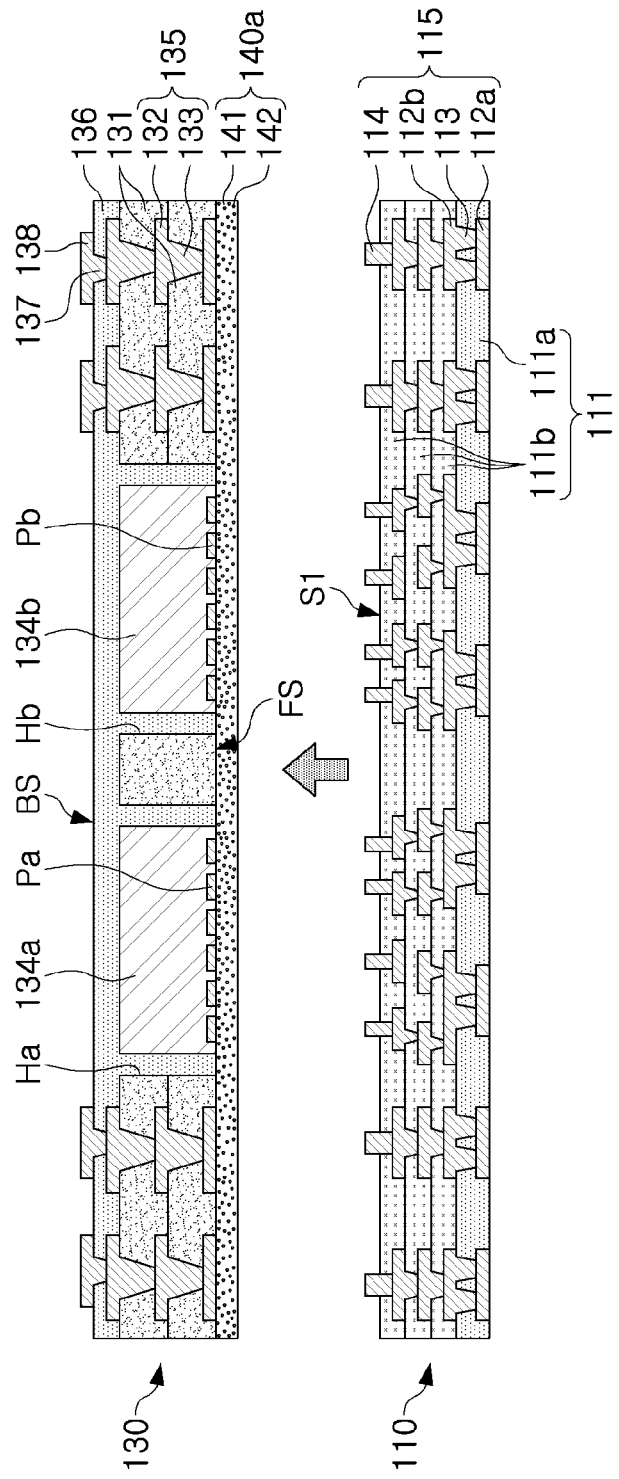
Figure 9C:
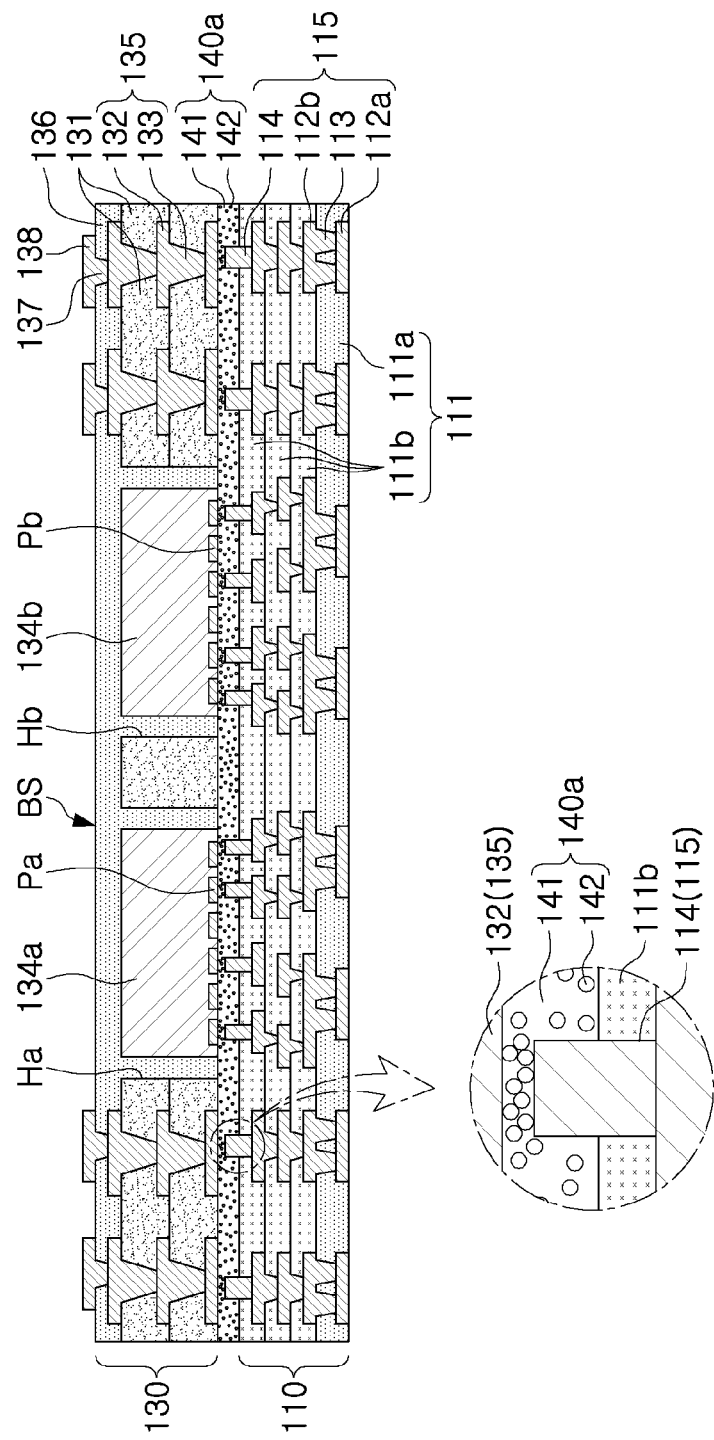

Referring to FIGS. 9B and 9C, the first redistribution structure 110 may be compressed on the front surface FS of the substrate structure 130 such that the first redistribution conductor 115 exposed on the first surface S1 of the first redistribution structure 110 may be electrically connected to the connection terminals Pa and Pb or the vertical connection conductor 135 exposed on the front surface FS through the first conductive particles 142 (S142). For example, in some example embodiments, the first carrier C1 may be removed from the first redistribution structure 110, and the first redistribution structure 110 may be compressed on the front surface FS of the substrate structure 130. In an example embodiment, the first redistribution conductor 115 may include the first protruding pad 114 protruding from the first surface S1, and the first redistribution structure 110 may be compressed, such that the first protruding pad 114 may be embedded in the first anisotropic conductive film 140a, as illustrated in FIG. 9C. Accordingly, the first protruding pad 114, the vertical connection conductor 135, and the connection terminals Pa and Pb may be electrically connected to each other by the first conductive particles 142 compressed therebetween.

Figure 9D:
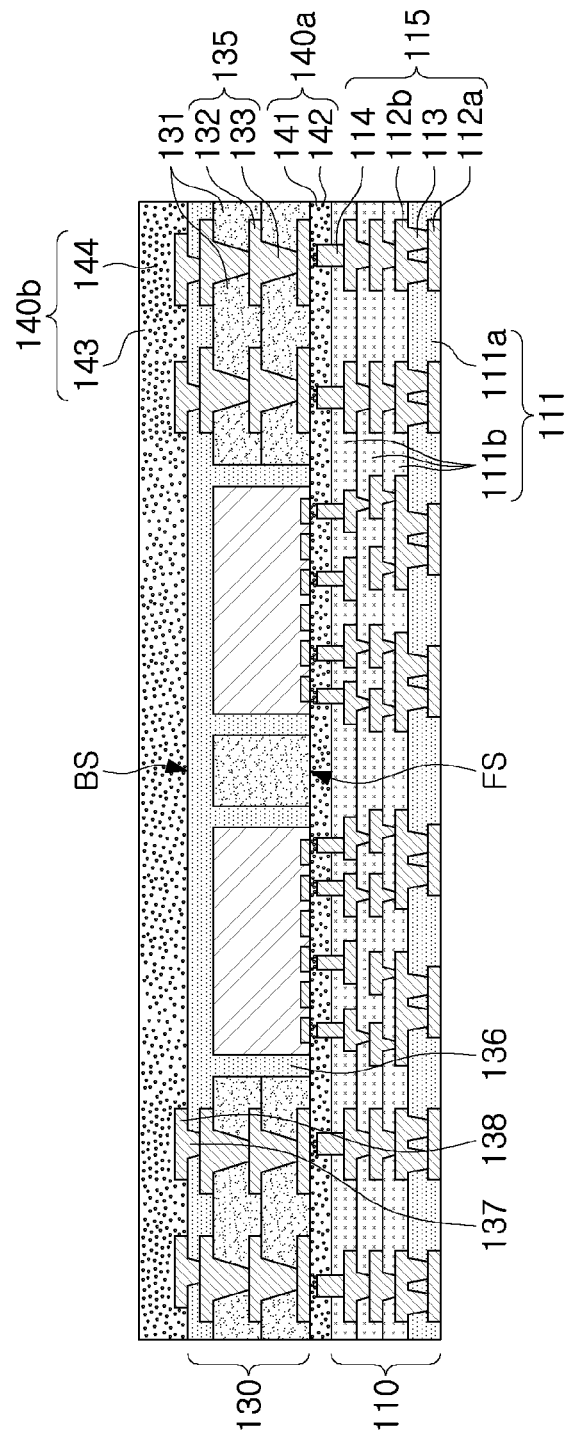

Referring to FIG. 9D, the second anisotropic conductive film 140b including the second conductive particles 144 may be attached to the rear surface BS of the substrate structure 130 (S143). The second anisotropic conductive film 140b may be an adhesive film in which a plurality of second conductive particles 144 are dispersed in the insulating resin 143. The rear wiring layer 138 protruding on the rear surface BS of the substrate structure 130 may be disposed, and the second anisotropic conductive film 140b may be attached to the rear surface BS of the substrate structure 130 such that the rear wiring layer 138 is embedded in the insulating resin 143. Since the insulating resin 143 and the second conductive particles 144 have the same characteristics as described above, overlapping descriptions will not be provided for conciseness.

Figure 9E:
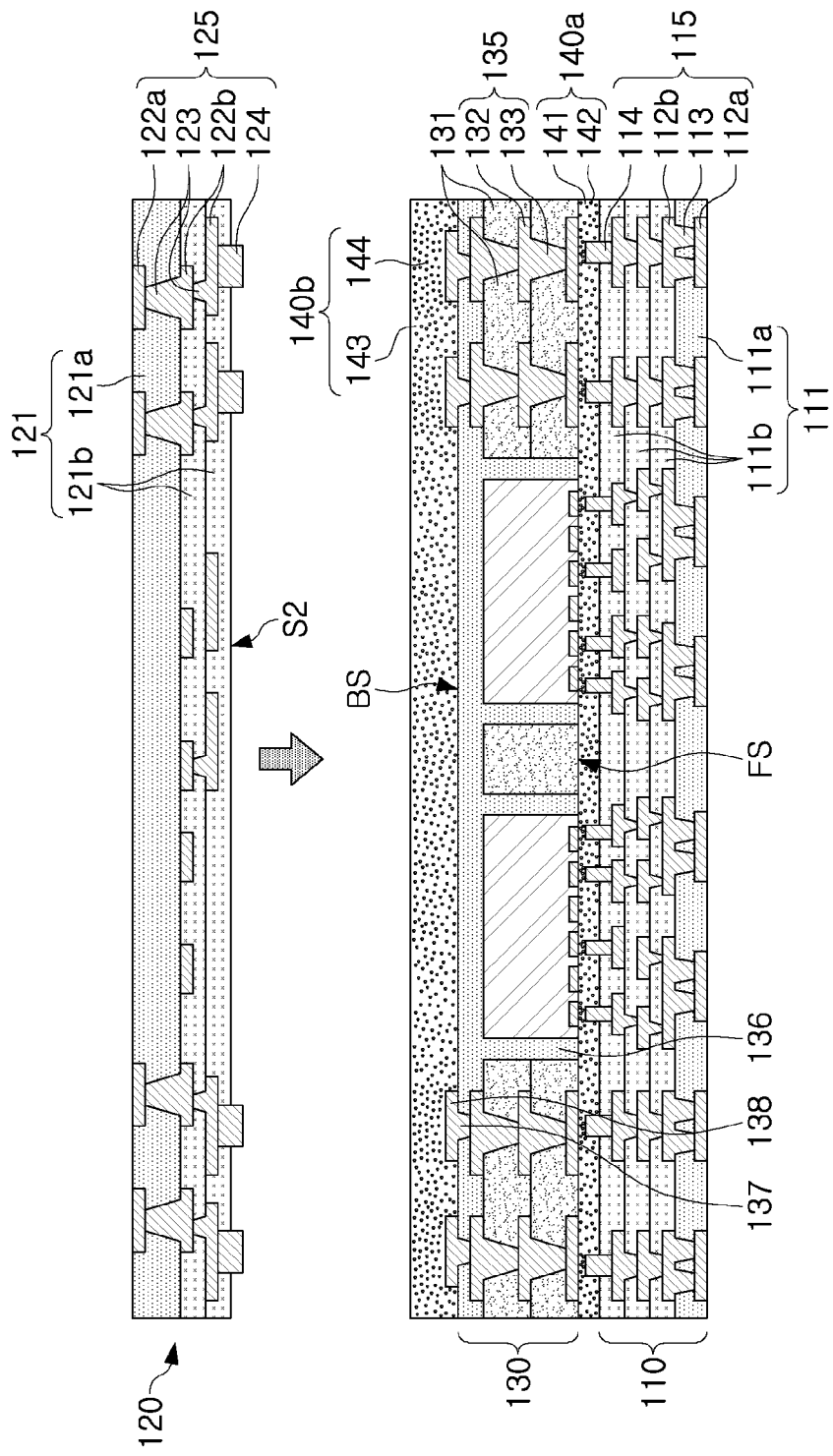
Figure 9F:
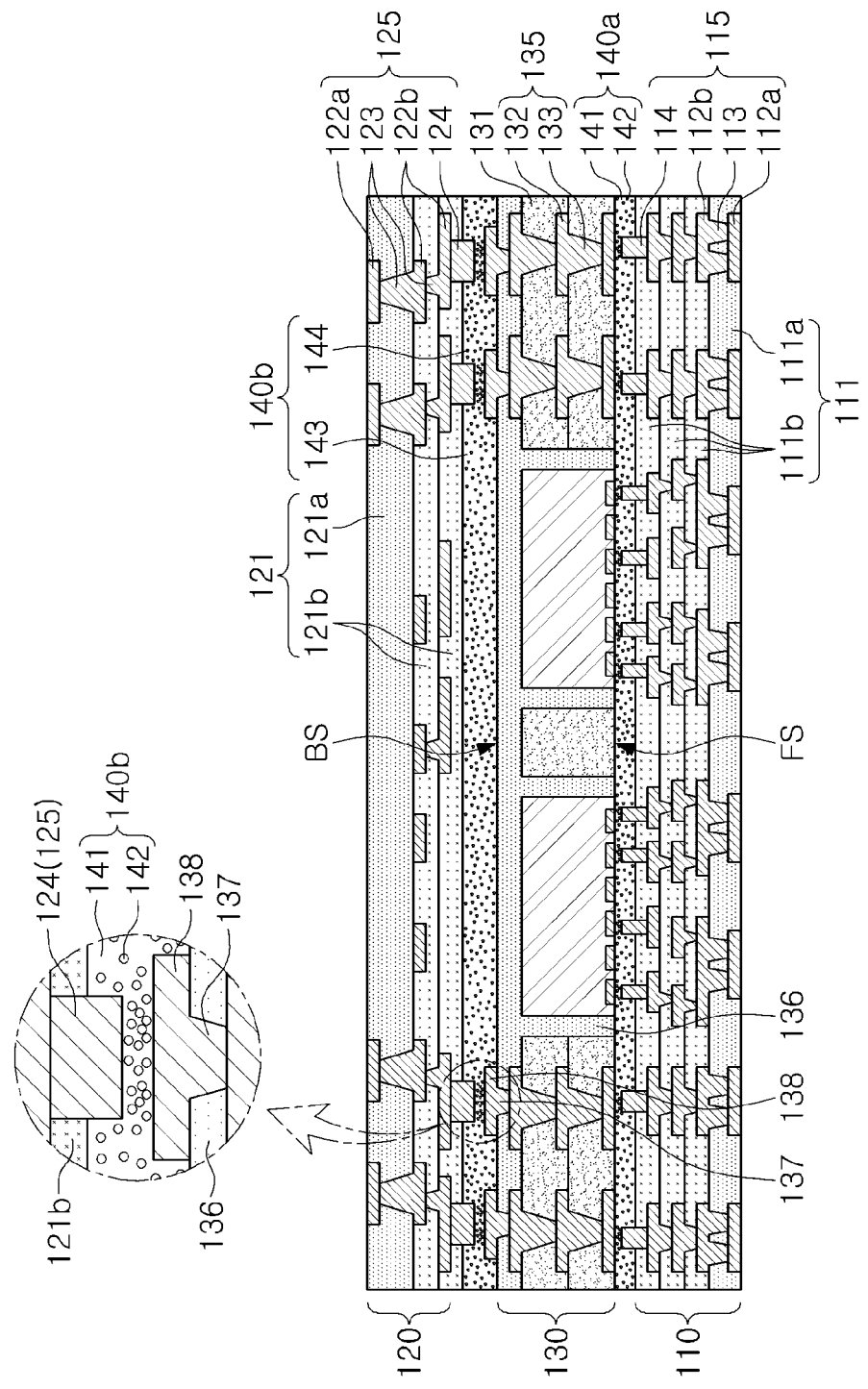

Referring to FIGS. 9E and 9F, the second redistribution structure 120 may be compressed on the rear surface BS of the substrate structure 130 such that the second redistribution conductor 125 exposed on the second surface S2 of the second redistribution structure 120 may be electrically connected to the vertical connection conductor 135 or the rear wiring layer 138 through the second conductive particles 144 (S144). For example, in some example embodiments, the second carrier C2 may be removed from the second redistribution structure 120, and the second redistribution structure 120 may be compressed on the rear surface BS of the substrate structure 130. In an example embodiment, the second redistribution conductor 125 may include the second protruding pad 124 protruding from the second surface S2, and the second redistribution structure 120 may be compressed such that the second protruding pad 124 is embedded in the second anisotropic conductive film 140b, as illustrated in FIG. 9F. Accordingly, the second protruding pad 124 and the vertical connection conductor 135 or the rear wiring layer 138 may be electrically connected to each other by the second conductive particles 144 compressed therebetween.

As described above, in the example embodiment, by manufacturing the first and second redistribution structures 110 and 120 and the substrate structure 130 in independent and separate manufacturing processes, and physically and electrically coupling the substrate structure 130 to the first and second redistribution structures 110 and 120 using the anisotropic conductive films, the turnaround time (TAT) of the semiconductor package may be significantly shortened, the amount of distortion created during the multilayer stacking process may be minimized, and fine pitches of the first and second redistribution structures 110 and 120 may be implemented.

Hereinafter, semiconductor packages which may be implemented by the above-described manufacturing process will be described according to an example embodiment with reference to FIGS. 10A to 13.

Figure 10A:
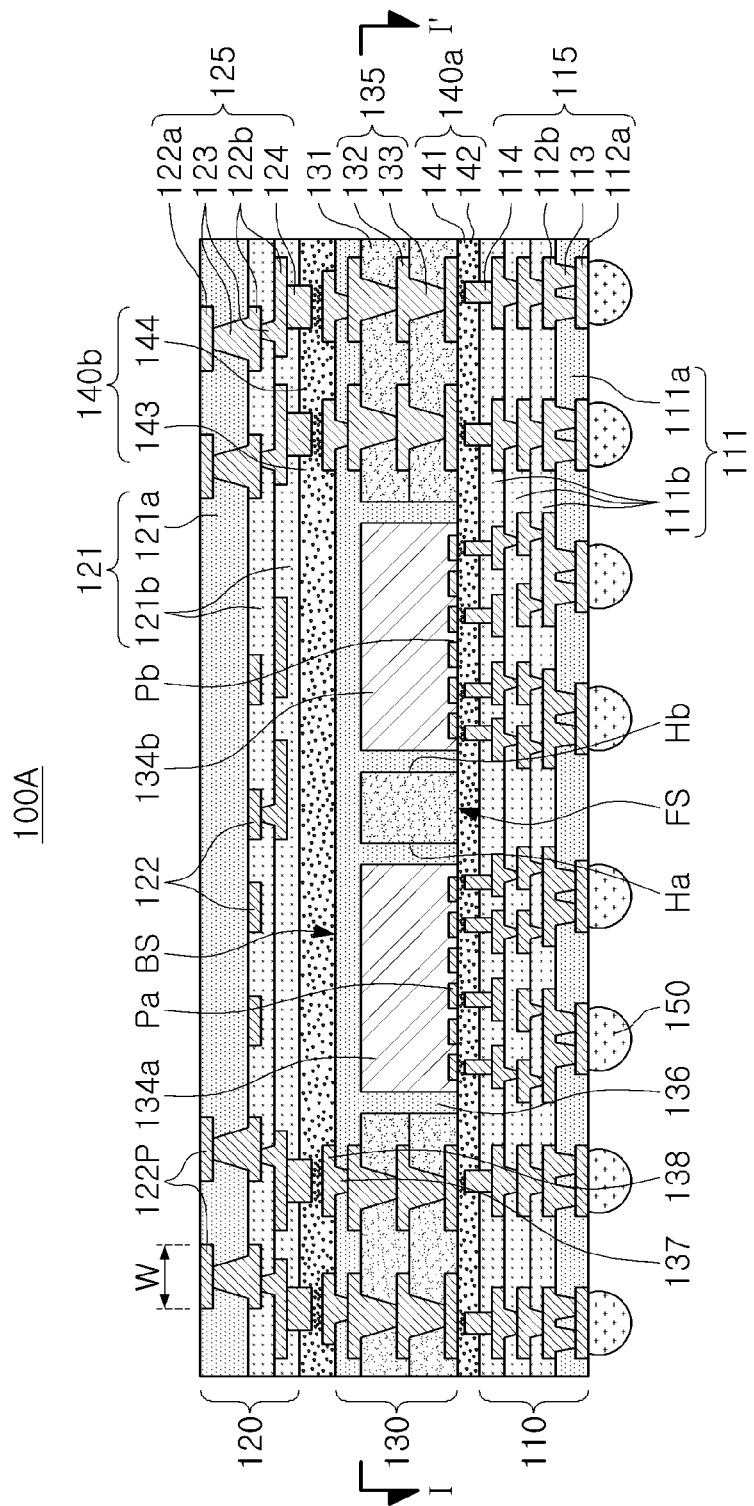
FIG. 10A is a cross-sectional diagram illustrating a semiconductor package according to an example embodiment.
Figure 10B:
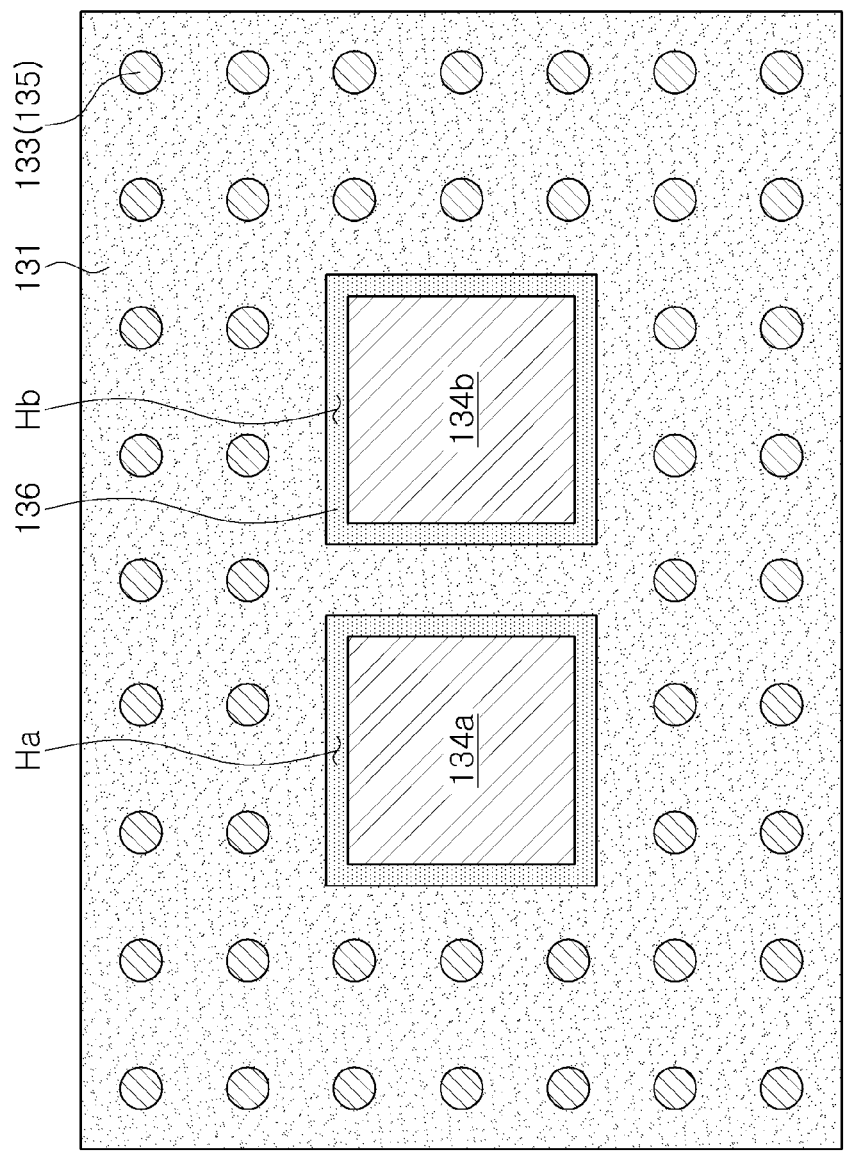
FIG. 10B is a plan diagram illustrating a cross-sectional surface taken along line I-I' in FIG. 10A, according to an example embodiment.

FIG. 10A is a cross-sectional diagram illustrating a semiconductor package 100A according to an example embodiment. FIG. 10B is a plan diagram illustrating a cross-sectional surface taken along line I-I' in FIG. 10A.

Referring to FIGS. 10A and 10B, the semiconductor package 100A may include semiconductor chips 134a and 134b having active surfaces on which connection terminals Pa and Pb are disposed, a vertical connection conductor 135 disposed around the semiconductor chips 134a and 134b, an encapsulant 136 encapsulating at least a portion of the semiconductor chips 134a and 134b and the vertical connection conductor 135, and having a front surface FS on which at least a portion of each of the connection terminals Pa and Pb and the vertical connection conductor 135 is exposed, and a rear surface BS disposed opposite to the front surface, a first redistribution structure 110 disposed on the front surface FS and including a first redistribution conductor 115 electrically connected to the connection terminals Pa and Pb and the vertical connection conductor 135, a second redistribution structure 120 disposed on the rear surface BS and including a second redistribution conductor 125 electrically connected to the vertical connection conductor 135, a first anisotropic conductive film 140a disposed between the front surface FS of the encapsulant 136 and the first redistribution structure 110 and including first conductive particles 142, and a second anisotropic conductive film 140b disposed between the rear surface BS of the encapsulant 136 and the second redistribution structure 120 and including second conductive particles 144.

The semiconductor package 100A in the example embodiment may further include a rear wiring layer 138 disposed on the encapsulant 136, and a rear via 137 penetrating a portion of the encapsulant 136 covering an upper portion of the vertical connection conductor 135 and connecting the rear wiring layer 138 to the vertical connection conductor 135. Accordingly, the first redistribution conductor 115 may be electrically connected to the connection terminals Pa and Pb or the vertical connection conductor 135 through the first conductive particles 142, and the second redistribution conductor 125 may be electrically connected to the rear wiring layer 138 or the vertical connection conductor 135 through the second conductive particles 144. In an example embodiment, the first redistribution conductor 115 may include a first protruding pad 114 embedded in the first anisotropic conductive film 140a, and the second redistribution conductor 125 may include a second protruding pad 124 embedded in the second anisotropic conductive film 140b.

The vertical connection conductor 135 may include the wiring layer 132 and the wiring via 133 formed in the substrate 131, but example embodiments are not limited thereto. In some example embodiments, the vertical connection conductor 135 may have a post shape directly penetrating the encapsulant 136.

For example, in the related art when semiconductor chips and an encapsulant are formed on a first redistribution structure, and a second redistribution structure is continuously and sequentially formed on the encapsulant (hereinafter, referred to as a related art comparative example), it may be difficult to form a second redistribution conductor with a fine pitch due to warpage, process errors, thermal deformation, or the like, occurring during the multilayer stacking process. Therefore, according to a manufacturing method of the related art comparative example, it may be difficult for connection pads disposed on an uppermost side of the second redistribution conductor to have a pad pitch of about 0.4 mm or less and a width of about 300 μm or less. In other words, in the manufacturing method of the related art comparative example, the pad pitch is greater than 0.4 mm and has a width of greater than 300 µm. The "pad pitch" may be defined as a value obtained by adding the width of the connection pad to the spacing between the adjacent connection pads. Also, in the related art comparative example, it may be difficult for second redistribution layers of the second redistribution conductor to have a line-and-space standard of about 10 µm/about 13 µm or less (i.e., a line width of 10 µm or less and a spacing of about 13 µm or less). In other words, in the manufacturing method of the related art comparative example, the line-and-space standard is greater than 10 µm/13 µm. "Line and space" may be defined as a line width ("line") of the second redistribution layer and a spacing ("space") between adjacent second redistribution layers.

In the example embodiment, since the second redistribution structure 120 is independently and separately manufactured, the amount of distortion created during the multilayer stacking process may be reduced, and the second redistribution conductor 125 may be formed with a fine pitch. For example, the plurality of connection pads 122P disposed on the uppermost side of the second redistribution conductor 125 may have a pad pitch of about 0.4 mm or less and a width of about 300 µm or less, and the second redistribution layers 122 of the conductor 125 may have a line-and-space standard of about 10 µm/about 13 µm or less (i.e., a line width of 10 µm or less and a spacing of about 13 µm or less), such as, for example, about 7 µm/about 8 µm, or about 2 µm/about 3 µm. In an example embodiment, the second redistribution conductor 125 may include a plurality of connection pads 122P disposed opposite to the second protruding pad 124, and a distance between the plurality of connection pads 122P may be about 10 µm to about 30 µm, about 15 µm to about 25 µm, or about 15 µm to about 20 µm, and the width W of each of the plurality of connection pads 122P may be about 300 µm or less, such as, for example, in a range of about 100 µm to about 300 µm, about 200 µm to about 300 µm, or about 250 µm to about 290 µm. The above-described values may also be applied to the second protruding pads 124 formed on the uppermost side during the process of manufacturing the second redistribution structure 120, and thus a repeated description thereof is omitted for conciseness.

Figure 11:
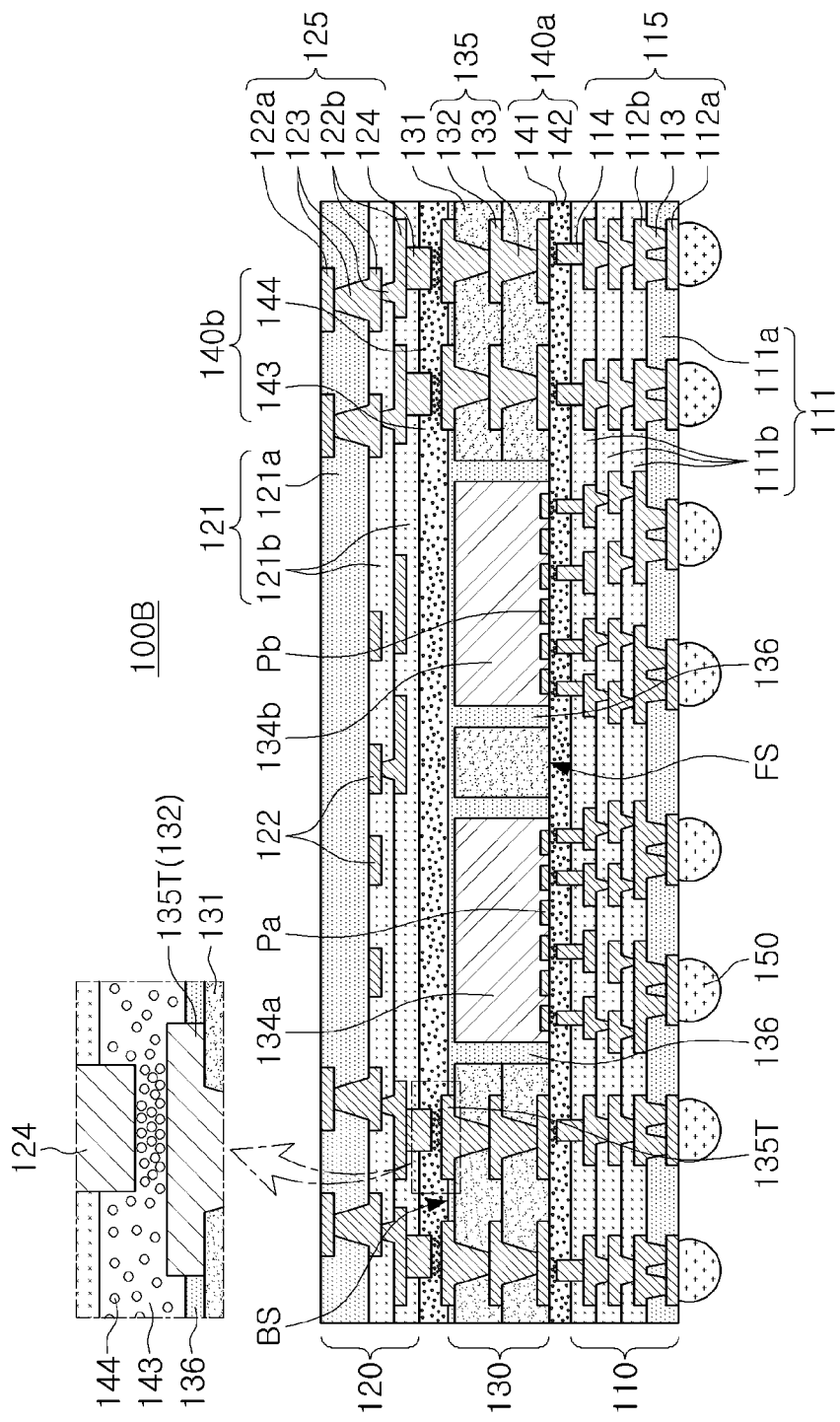
FIG. 11 is a cross-sectional diagram illustrating a semiconductor package according to an example embodiment.
Figure 12:
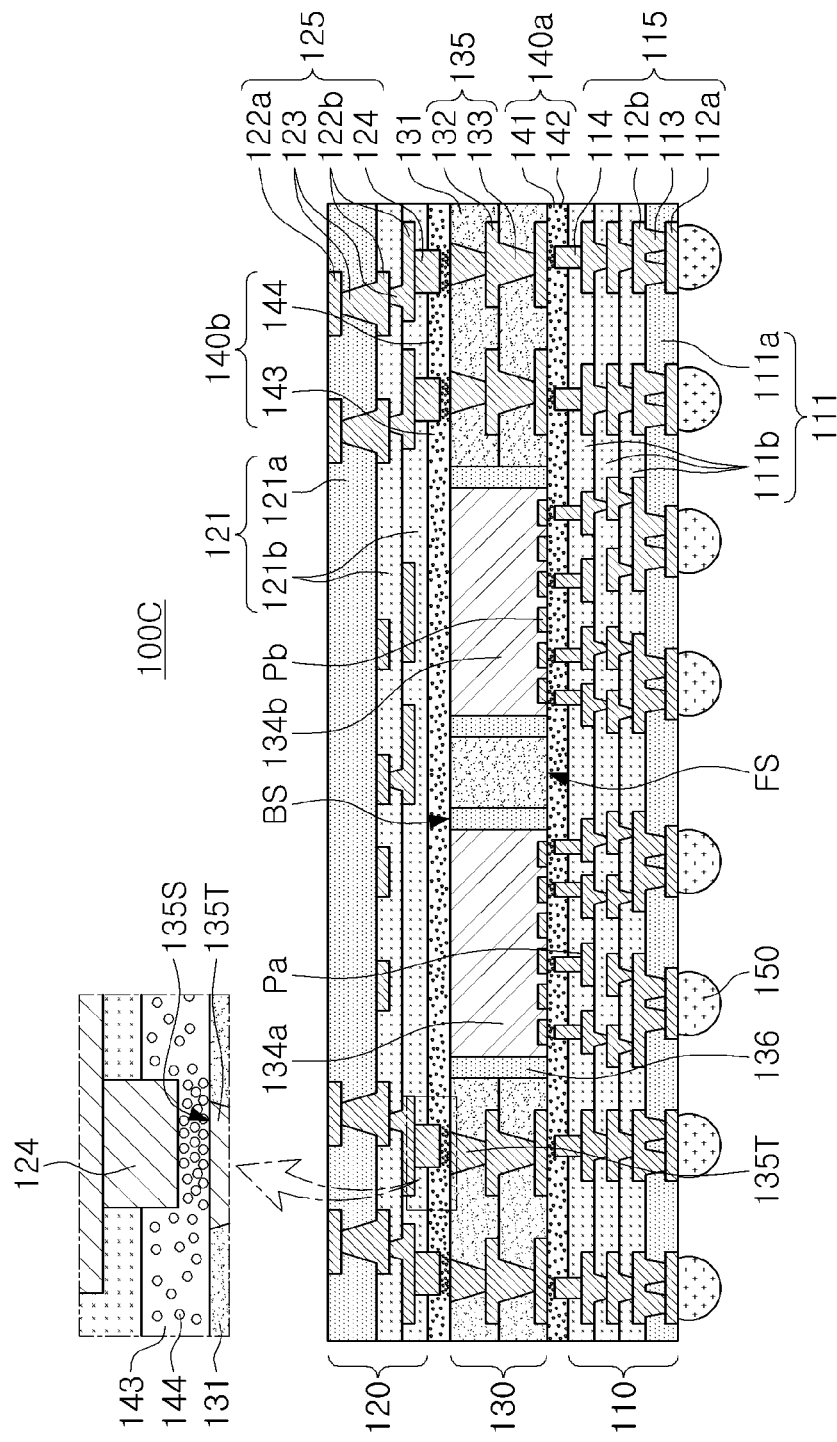
FIG. 12 is a cross-sectional diagram illustrating a semiconductor package according to an example embodiment.

FIGS. 11 and 12 are cross-sectional diagrams illustrating semiconductor packages 100B and 100C according to various example embodiments.

Referring to FIG. 11, the semiconductor package 100B may have the configuration the same as or similar to the semiconductor package 100A in FIG. 10A, other than a configuration in which at least a portion 135T (or upper portion) of the vertical connection conductor 135 is exposed from the rear surface BS (or upper surface) of the encapsulant 136. In an example embodiment, the rear surface BS (or upper surface) of the encapsulant 136 may be disposed on a level lower than that of the upper surface 135T of the vertical connection conductor 135 by a planarization process, such as, for example, a laser ablation (LA) process. Accordingly, the upper portion 135T of the vertical connection conductor 135 may protrude further than the upper surface or the rear surface BS of the encapsulant 136, and may be embedded in the second anisotropic conductive film 140b. As discussed above, the remaining configuration may be the same as or similar to the semiconductor package 100A in FIG. 10A, and thus a repeated description thereof is omitted for conciseness.

Referring to FIG. 12, the semiconductor package 100C may have the configuration the same as or similar to the semiconductor package 100B in FIG. 11, other than the configuration in which at least a portion 135T (or upper portion) of the vertical connection conductor 135 is exposed at the rear surface BS (or upper surface) of the encapsulant 136. However, the semiconductor package 100C may be different from the semiconductor package 100B in FIG. 11 in that the upper portion 135T of the vertical connection conductor 135 does not protrude further than the upper surface or the rear surface BS of the encapsulant 136. In an example embodiment, the upper surface BS of the encapsulant 136 may be coplanar with the upper surface 135S of the vertical connection conductor 135 and may be made coplanar by a CMP process, which may indicate that a step portion is not intentionally formed the CMP process, and which may include a level difference due to a process error. As discussed above, the remaining configuration may be the same as or similar to the semiconductor package 100B in FIG. 11, and thus a repeated description thereof is omitted for conciseness.

Figure 13:
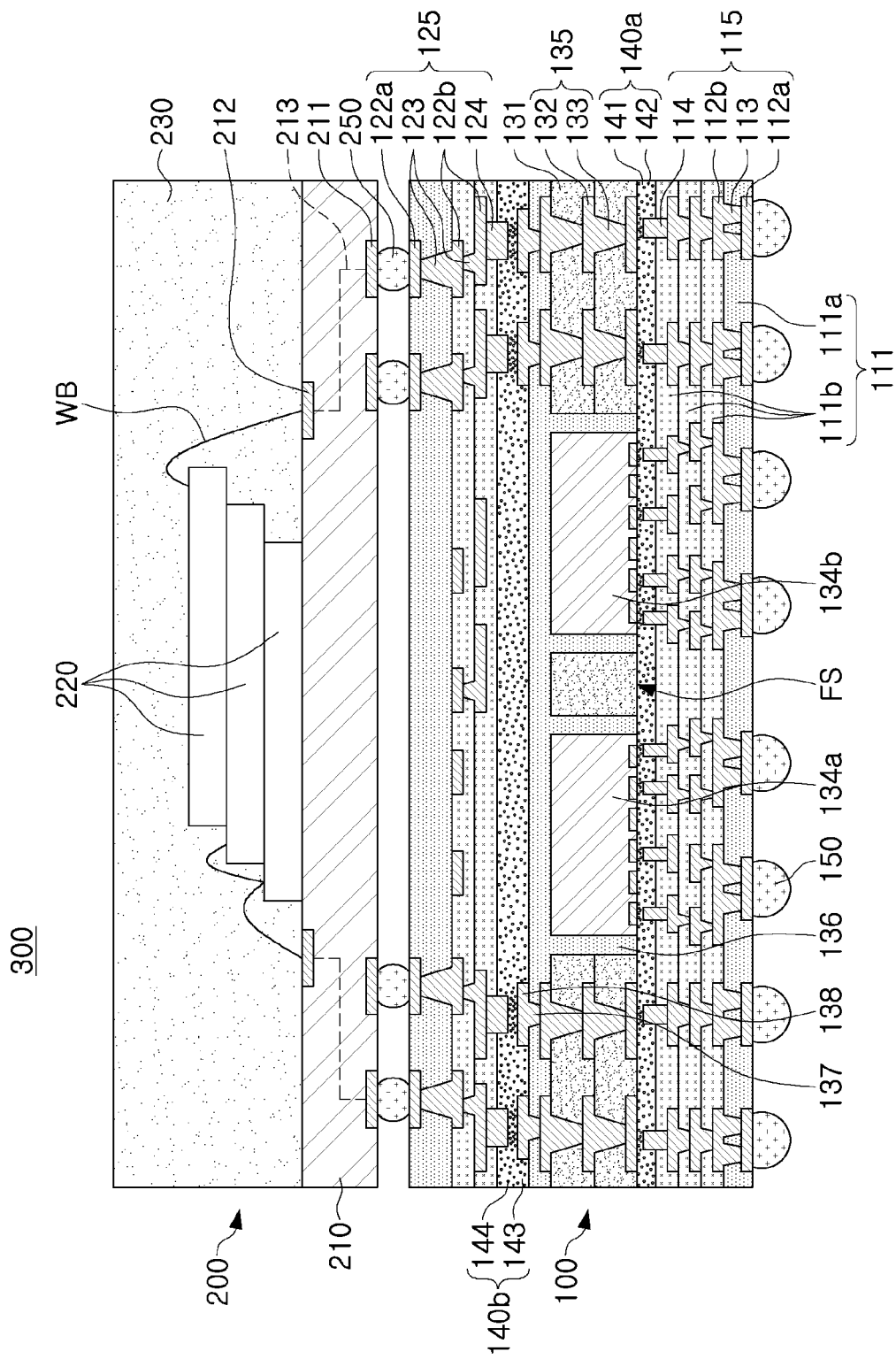
FIG. 13 is a cross-sectional diagram illustrating a semiconductor package according to an example embodiment.

FIG. 13 is a cross-sectional diagram illustrating a semiconductor package 300 according to an example embodiment.

Referring to FIG. 13, the semiconductor package 300 may include a first package 100 and a second package 200. The first package 100 may be the same as the semiconductor package 100A illustrated in FIGS. 10A and 10B, and may have configurations the same as or similar to those of the semiconductor packages 100A, 100B, and 100C described with reference to FIGS. 10A to 12, accordingly a repeated description thereof is omitted for conciseness.

The second package 200 may include a redistribution substrate 210, a second semiconductor chip 220, and a second encapsulant 230. The redistribution substrate 210 may include a lower pad 211 and an upper pad 212 electrically connected to an external entity on a lower surface and an upper surface thereof, respectively. Also, the redistribution substrate 210 may include a redistribution circuit 213 electrically connecting the lower pad 211 to the upper pad 212.

The second semiconductor chip 220 may be mounted on the redistribution substrate 210 by wire bonding or flip-chip bonding. For example, in some example embodiments, the second semiconductor chip 220 may include a plurality of second semiconductor chips 220 and the plurality of second semiconductor chips 220 may be vertically stacked on the redistribution substrate 210 and may be electrically connected to the upper pad 212 of the redistribution substrate 210 by a bonding wire WB. In an example embodiment, the second semiconductor chip 220 may include a memory chip, and the first semiconductor chips 134a and 134b may include an AP chip or a PMIC chip.

The second encapsulant 230 may include an insulating material the same as or similar to the first encapsulant 136 of the first package 100. The second package 200 may be physically and electrically connected to the first package 100 by metal bumps 250. The metal bump 250 may be electrically connected to the redistribution circuit 213 in the redistribution substrate 210 through the lower pad 211 of the redistribution substrate 210. The metal bump 250 may include a low melting point metal, such as, for example, tin (Sn) or an alloy including tin (Sn).

According to the aforementioned example embodiments, by independently and separately performing the processes of forming the first redistribution structure, the second redistribution structure, and the substrate structure, a method of manufacturing a semiconductor package in which turn-around time (TAT) is reduced, and a semiconductor package may be provided.

Also, a method of manufacturing a semiconductor package in which a fine pitch of the second redistribution structure is implemented, and a semiconductor package may be provided.

While the example embodiments have been illustrated and described above, it will be apparent to those skilled in the art that modifications and variations may be made without departing from the scope of the present disclosure as defined by the appended claims.

What is claimed is:

1. A method comprising:
forming a substrate structure including a vertical connection conductor and a semiconductor chip;
forming a first redistribution structure including a first redistribution conductor;
forming a second redistribution structure including a second redistribution conductor; and
compressing the first redistribution structure and the second redistribution structure on a front surface and a rear surface of the substrate structure, respectively, using anisotropic conductive films including conductive particles,
wherein the forming the substrate structure, the forming the first redistribution structure, and the forming the second redistribution structure are performed independently and separately,
wherein the first redistribution conductor is electrically connected to the vertical connection conductor and the semiconductor chip by the conductive particles, and
wherein the second redistribution conductor is electrically connected to the vertical connection conductor by the conductive particles.

2. The method of claim 1, wherein the forming the substrate structure includes disposing the vertical connection conductor and the semiconductor chip on a tape carrier, and forming an encapsulant encapsulating at least a portion of the semiconductor chip and the vertical connection conductor.

3. The method of claim 2, wherein the forming the substrate structure further includes forming a rear wiring layer and a rear via penetrating a portion of the encapsulant covering an upper portion of the vertical connection conductor and connecting the rear wiring layer to the vertical connection conductor, on the encapsulant.

4. The method of claim 2, wherein the forming the substrate structure further includes removing a portion of the encapsulant covering an upper portion of the vertical connection conductor such that at least a portion of the vertical connection conductor is exposed on the rear surface of the substrate structure.

5. The method of claim 1,
wherein the forming the first redistribution structure includes:
forming a first outer redistribution layer on a first carrier;
forming a first outer insulating layer covering the first outer redistribution layer;
forming a first inner redistribution layer on the first outer insulating layer, and a first redistribution via penetrating the first outer insulating layer and connecting the first outer redistribution layer to the first inner redistribution layer; and
forming a first inner insulating layer covering the first inner redistribution layer, and a first protruding pad protruding from the first inner insulating layer,
wherein the first redistribution conductor includes the first outer redistribution layer, the first redistribution via, the first inner redistribution layer, and the first protruding pad.

6. The method of claim 5,
wherein the anisotropic conductive films include a first anisotropic conductive film that is interposed between the first redistribution structure and the substrate structure and that includes first conductive particles, and
wherein the first redistribution structure is compressed on the front surface of the substrate structure such that the first protruding pad is embedded in the first anisotropic conductive film.

7. The method of claim 1,
wherein the forming the second redistribution structure includes:
forming a second outer redistribution layer on a second carrier;
forming a second outer insulating layer covering the second outer redistribution layer;
forming a second inner redistribution layer on the second outer insulating layer, and a second redistribution via penetrating the second outer insulating layer and connecting the second outer redistribution layer to the second inner redistribution layer; and
forming a second inner insulating layer covering the second inner redistribution layer, and a second protruding pad protruding from the second inner insulating layer,
wherein the second redistribution conductor includes the second outer redistribution layer, the second redistribution via, the second inner redistribution layer, and the second protruding pad.

8. The method of claim 7,
wherein the anisotropic conductive films include a second anisotropic conductive film interposed between the second redistribution structure and the substrate structure and including second conductive particles, and
wherein the second redistribution structure is compressed on the rear surface of the substrate structure such that the second protruding pad is embedded in the second anisotropic conductive film.

9. A method comprising:
forming a substrate structure including a substrate including at least one through-hole and a vertical connection conductor disposed around the at least one through-hole, at least one semiconductor chip disposed in the at least one through-hole and having a connection terminal, and an encapsulant filling the at least one through-hole, the substrate structure having a front surface at which at least a portion of each of the connection terminal and the vertical connection conductor is exposed, and a rear surface disposed opposite to the front surface;
forming a first redistribution structure including a first redistribution conductor and having a first surface to which at least a portion of the first redistribution conductor is exposed;
forming a second redistribution structure including a second redistribution conductor and having a second surface to which at least a portion of the second redistribution conductor is exposed;

attaching a first anisotropic conductive film including first conductive particles to the front surface of the substrate structure;

compressing the first redistribution structure to the front surface of the substrate structure such that the at least a portion of the first redistribution conductor that is exposed is electrically connected by the first conductive particles to the at least a portion of the connection terminal or the at least a portion of the vertical connection conductor that is exposed;

attaching a second anisotropic conductive film including second conductive particles to the rear surface of the substrate structure; and compressing the second redistribution structure on the rear surface of the substrate structure such that the at least a portion of the second redistribution conductor that is exposed is electrically connected by the second conductive particles to the vertical connection conductor.

10. The method of claim 9,
wherein the first redistribution conductor includes a plurality of first protruding pads protruding from the first surface, and
wherein the compressing the first redistribution structure is performed such that the plurality of first protruding pads are embedded in the first anisotropic conductive film.

11. The method of claim 9,
wherein the second redistribution conductor includes a plurality of second protruding pads protruding from the second surface, and
wherein the compressing the second redistribution structure is performed such that the plurality of second protruding pads are embedded in the second anisotropic conductive film.

12. A method comprising:
forming a substrate structure including a semiconductor chip including a connection terminal, a vertical connection conductor disposed around the semiconductor chip, and an encapsulant encapsulating at least a portion of the semiconductor chip and the vertical connection conductor, the substrate structure having a front surface at which at least a portion of each of the connection terminal and the vertical connection conductor is exposed, and a rear surface disposed opposite to the front surface;

forming a first redistribution structure including at least one first insulating layer, and a first redistribution conductor disposed in the at least one first insulating layer, the first redistribution structure having a first surface at which at least a portion of the first redistribution conductor is exposed;

forming a second redistribution structure including at least one second insulating layer, and a second redistribution conductor disposed in the at least one second insulating layer, the second redistribution structure having a second surface at which at least a portion of the second redistribution conductor is exposed;

attaching a first anisotropic conductive film including first conductive particles to the front surface of the substrate structure;

compressing the first redistribution structure on the front surface of the substrate structure such that the at least a portion of the first redistribution conductor that is exposed is electrically connected by the first conductive particles to the at least a portion of the connection terminal or the at least a portion of the vertical connection conductor that is exposed;

attaching a second anisotropic conductive film including second conductive particles to the rear surface of the substrate structure; and compressing the second redistribution structure on the rear surface of the substrate structure such that the at least a portion of the second redistribution conductor that is exposed is electrically connected by the second conductive particles to the vertical connection conductor.

13. The method of claim 12, wherein the forming the substrate structure, the forming the first redistribution structure, and the forming the second redistribution structure are performed independently and separately.

14. The method of claim 12, wherein the compressing the first redistribution structure and the compressing the second redistribution structure are performed by thermocompression bonding or thermosonic bonding.

15. The method of claim 14, wherein the compressing the first redistribution structure and the compressing the second redistribution structure are performed in a temperature range of about 100° C. to about 300° C.

16. The method of claim 12, wherein the first anisotropic conductive film includes an insulating resin, and the first conductive particles are disposed in the insulating resin of the first anisotropic conductive film, and
the second anisotropic conductive film includes an insulating resin, and the second conductive particles are disposed in the insulating resin of the second anisotropic conductive film.

17. The method of claim 16, wherein the insulating resin includes at least one of an epoxy resin, polyurethane, acrylic resin, polyethylene, silicone polymer, styrene butadiene block copolymer, or styrene-ethylene-propylene-styrene block copolymer.

18. The method of claim 12, wherein each of the first conductive particles and the second conductive particles has a form in which a conductive material is coated on a surface of a core particle having a diameter in a range of about 1 µm to about 50 µm.

19. The method of claim 18, wherein the conductive material includes gold (Au), silver (Ag), nickel (Ni), or lead (Pd).

20. The method of claim 12, wherein each of the first anisotropic conductive film and the second anisotropic conductive film has a thickness in a range of about 5 µm to about 50 µm.

* * * * *